(12) United States Patent
Elahipanah

(10) Patent No.: US 12,328,914 B2
(45) Date of Patent: *Jun. 10, 2025

(54) BURIED GRID WITH SHIELD IN WIDE BAND GAP MATERIAL

(71) Applicant: II-VI ADVANCED MATERIALS, LLC, Pine Brook, NJ (US)

(72) Inventor: Hossein Elahipanah, Sollentuna (SE)

(73) Assignee: II-VI ADVANCED MATERIALS, LLC, Pine Brook, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/631,641

(22) Filed: Apr. 10, 2024

(65) Prior Publication Data

US 2024/0258368 A1    Aug. 1, 2024

Related U.S. Application Data

(63) Continuation of application No. 18/182,621, filed on Mar. 13, 2023, now Pat. No. 11,984,474, which is a
(Continued)

(30) Foreign Application Priority Data

May 22, 2018  (SE) .................................... 1850601-4

(51) Int. Cl.
*H10D 62/10* (2025.01)
*H10D 8/60* (2025.01)
(Continued)

(52) U.S. Cl.
CPC ............ *H10D 62/106* (2025.01); *H10D 8/60* (2025.01); *H10D 62/80* (2025.01);
(Continued)

(58) Field of Classification Search
CPC ............ H01L 29/0619; H01L 29/1602; H01L 29/1608; H01L 29/2003; H01L 29/24;
(Continued)

(56) References Cited

U.S. PATENT DOCUMENTS 9,704,949 B1   7/2017  Ghandi et al.
11,114,557 B2  9/2021  Thierry-Jebali et al.
(Continued)

FOREIGN PATENT DOCUMENTS

CN   104157703 A   11/2014
CN   104409519 A    3/2015
(Continued)

OTHER PUBLICATIONS

"International Search Report and Written Opinion in PCT Appl. PCT/EP2019/063194, dated Jul. 31, 2019, 10-pgs."
(Continued)

*Primary Examiner* — Monica D Harrison
(74) *Attorney, Agent, or Firm* — Blank Rome LLP

(57) ABSTRACT

There is disclosed a structure in a wide band gap material such as silicon carbide wherein there is a buried grid and shields covering at least one middle point between two adjacent parts of the buried grid, when viewed from above. Advantages of the invention include easy manufacture without extra lithographic steps compared with standard manufacturing process, an improved trade-off between the current conduction and voltage blocking characteristics of a JBSD comprising the structure.

20 Claims, 25 Drawing Sheets

Related U.S. Application Data continuation of application No. 17/055,686, filed as application No. PCT/EP2019/063194 on May 22, 2019, now Pat. No. 11,626,478.

(51) Int. Cl.
*H10D 62/80* (2025.01)
*H10D 62/83* (2025.01)
*H10D 62/832* (2025.01)
*H10D 62/85* (2025.01)
*H10D 64/00* (2025.01)

(52) U.S. Cl.
CPC ..... *H10D 62/8303* (2025.01); *H10D 62/8325* (2025.01); *H10D 62/8503* (2025.01); *H10D 64/112* (2025.01)

(58) Field of Classification Search
CPC ..... H01L 29/404; H01L 29/872; H10D 62/80; H10D 62/106; H10D 62/8303; H10D 62/8325; H10D 62/8503; H10D 64/112; H10D 8/60
USPC .......................................................... 257/77
See application file for complete search history.

(56) References Cited

U.S. PATENT DOCUMENTS

| 11,626,478 B2* | 4/2023 | Elahipanah ............. H01L 29/24 257/77 |
| 11,984,474 B2* | 5/2024 | Elahipanah ........... H01L 29/404 |
| 2015/0061089 A1 | 3/2015 | Siemieniec et al. |

FOREIGN PATENT DOCUMENTS

| CN | 106298775 A | 1/2017 |
| JP | 2015162572 A | 9/2015 |

OTHER PUBLICATIONS

Hong, Li , "Application Guide for Devices and Integrated Circuits in Power Electronic Equipment", vol. 1: Power Semiconductor Devices and Their Driving Integrated Circuits, Jun. 30, 2001, pp. 139-140 (Machine translation and original Chinese language).

* cited by examiner

BURIED GRID WITH SHIELD IN WIDE BAND GAP MATERIAL

CROSS-REFERENCE TO RELATED APPLICATIONS

This application is a continuation of U.S. patent application Ser. No. 18/182,621, filed Mar. 13, 2023, which is a continuation of U.S. patent application Ser. No. 17/055,686, filed Nov. 16, 2020 (now U.S. Pat. No. 11,626,478), which is a U.S. National Stage of PCT/EP2019/063194, filed May 22, 2019, which claims priority to Swedish Patent Application No. 1850601-4, filed May 22, 2018. The aforementioned applications are hereby incorporated by reference in each of their entireties.

TECHNICAL FIELD

The present invention is directed to a structure with a buried grid comprising shields. The structure is intended for wide band gap materials where it is able to protect a device from effects of a high electric field. A junction barrier Schottky (JBS) diode comprising the structure shows an improvement.

BACKGROUND

Buried grids and their manufacture are well known. See, for instance Baliga et al. in IEEE Electron Device Letters, Volume 1, Issue 12, December 1980.

Different types of shielding mechanisms, such as surface grid and buried grid as well as trenches are known, proposed, and implemented to protect the sensitive part of high voltage wide band gap devices from the high electric field. Although these shielding mechanisms block the high electric field, a portion of the high electric field reaches the sensitive parts like the Schottky contact or thin gate oxide, where the maximum of the electric field peak occurs in the spacing between the grids, which limits the device performance.

Buried grid technology has the advantage that the shielding elements (p+ grids in n-drift layer or n+ grids in p− drift layer) are buried inside the drift layer and do not occupy the semiconductor surface. Therefore, it enables the possibility to apply additional protection on the semiconductor surface.

Even though buried grids are successfully used today, there is still room for an improvement. For example, it is desirable to improve the surge current capability of for instance buried grid JBS rectifiers based on silicon carbide (SiC).

It is desirable to improve the trade-off between current conducting and voltage blocking characteristics of a diode. It is further desirable to lower the capacitance of a diode.

SUMMARY

It is an object of the present invention to obviate at least some of the disadvantages in the prior art and provide an improved buried structure in a wide band gap material.

In a first aspect, there is provided a structure in a wide band gap material comprising a layer, where directions above and below are defined in relation to the layer, wherein the layer comprises a buried grid (2) being a regularly spaced pattern of parts (2) of doped wide band gap material of a first conductivity type (p or n), the buried grid (2) comprises spaces (3), so that the buried grid (2) is foraminous, wherein the spaces (3) comprise doped wide band gap material of an opposite conductivity type (n or p), wherein doped wide band gap material of the same conductivity type (n or p) as the spaces (3) is directly above (7) and below (1) the layer, wherein at least one shield (4) covers at least a middle point between two adjacent parts of the buried grid (2), when viewed in a projection (p) in a plane parallel with the layer comprising the buried grid (2).

In a second aspect, there is provided a method of designing a structure for a wide band gap material, said method comprising the steps of:
a. designing a layer comprising a buried grid (2) and spaces (3),
b. calculating the electric field around the buried grid (2) assuming that a voltage potential difference occurs over the layer,
c. positioning shields (4) where the electric field exceeds a defined value in a plane above layer.

In a third aspect, there is provided a junction barrier Schottky diode (JBSD) comprising a structure as described above.

Further aspects and embodiments are defined in the appended claims.

An advantage is that it is possible to obtain a better trade-off between the current conducting and voltage blocking characteristics in a JBSD comprising the structure. Thus, it is for instance possible to obtain lower forward resistance and higher current density for the same voltage blocking performance. A lower leakage current at similar current conduction performance may be obtained. A voltage blocking capability at higher temperature at similar current conduction performance may be obtained.

A further advantage is that it is possible to manufacture the structure without additional lithographic steps.

BRIEF DESCRIPTION OF THE DRAWINGS

The invention is now described, by way of example, with reference to the accompanying drawings, in which:

FIG. 8 in panels a-g shows a proposed manufacturing process of the JBS rectifier with shielding doped surface grid shown in FIG. 2b, panel a.

DETAILED DESCRIPTION

Before the invention is disclosed and described in detail, it is to be understood that this invention is not limited to particular compounds, configurations, method steps, substrates, and materials disclosed herein as such compounds, configurations, method steps, substrates, and materials may vary somewhat. It is also to be understood that the terminology employed herein is used for the purpose of describing particular embodiments only and is not intended to be limiting since the scope of the present invention is limited only by the appended claims and equivalents thereof.

It must be noted that, as used in this specification and the appended claims, the singular forms "a", "an" and "the" include plural referents unless the context clearly dictates otherwise.

If nothing else is defined, any terms and scientific terminology used herein are intended to have the meanings commonly understood by those of skill in the art to which this invention pertains.

As used herein a junction barrier Schottky diode is abbreviated JBSD and thus denotes a JBS diode. A junction barrier Schottky diode comprising a buried grid is denoted as BG-JBSD.

Figure 1A:
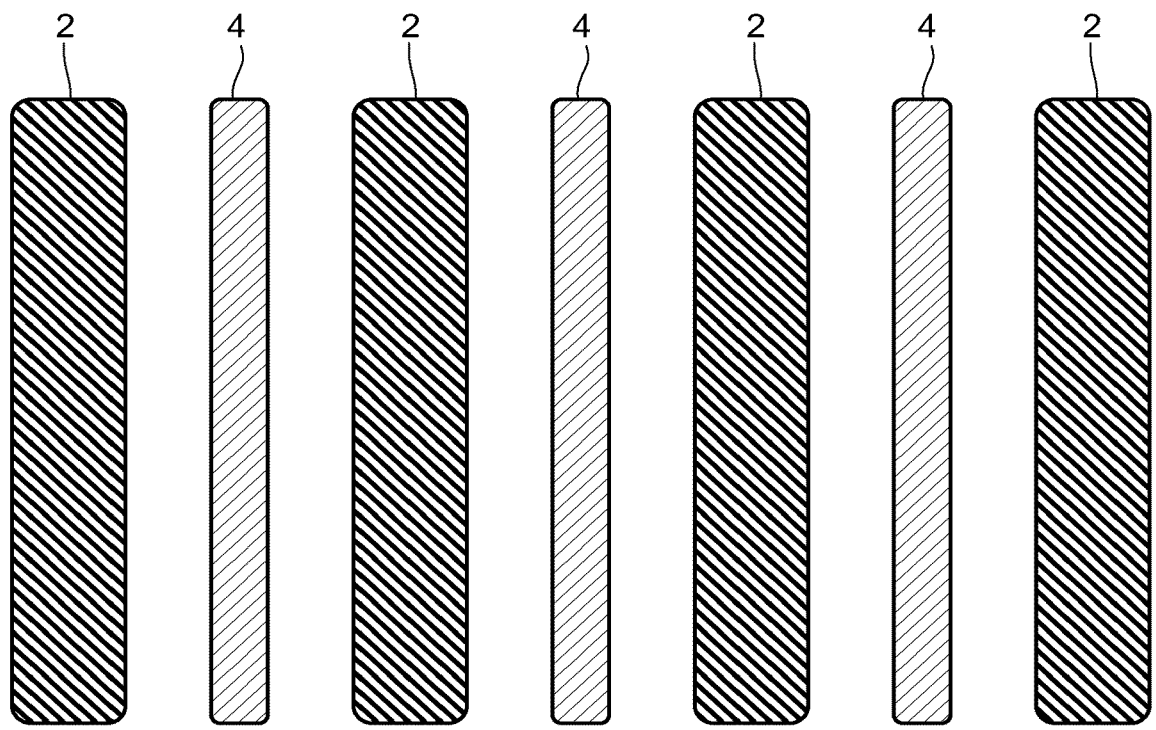
FIGS. 1a-1q illustrate a number of different embodiments of the invention, where a projection (p) in a plane parallel to the layer is shown. The projection of the buried grid (2) is shown relative to the projection of the shield(s) (4).
Figure 1B:
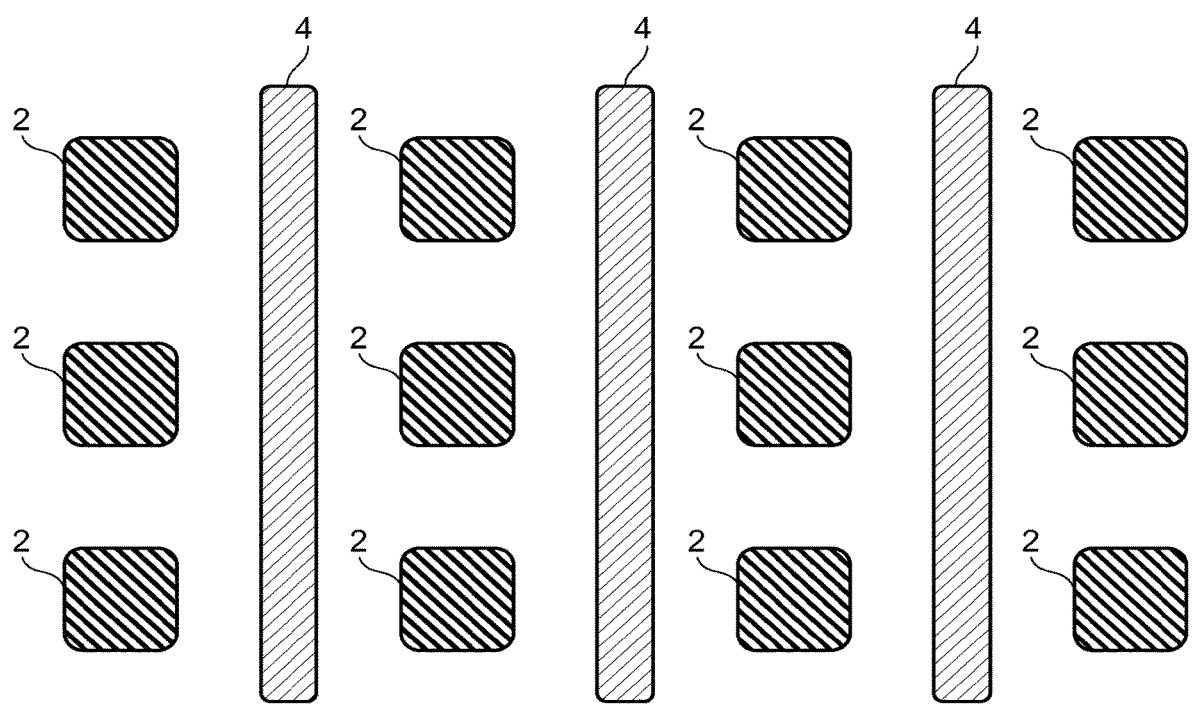
Figure 1C:
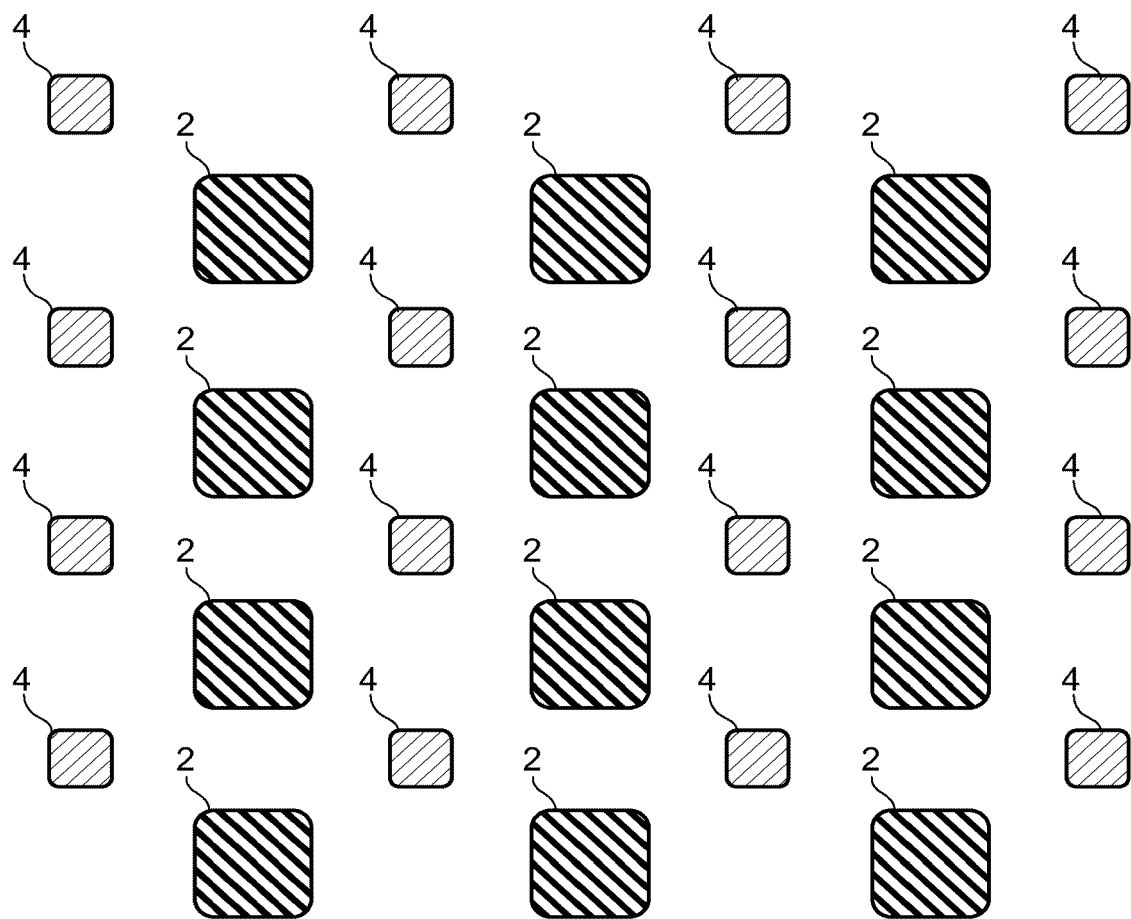
Figure 1D:
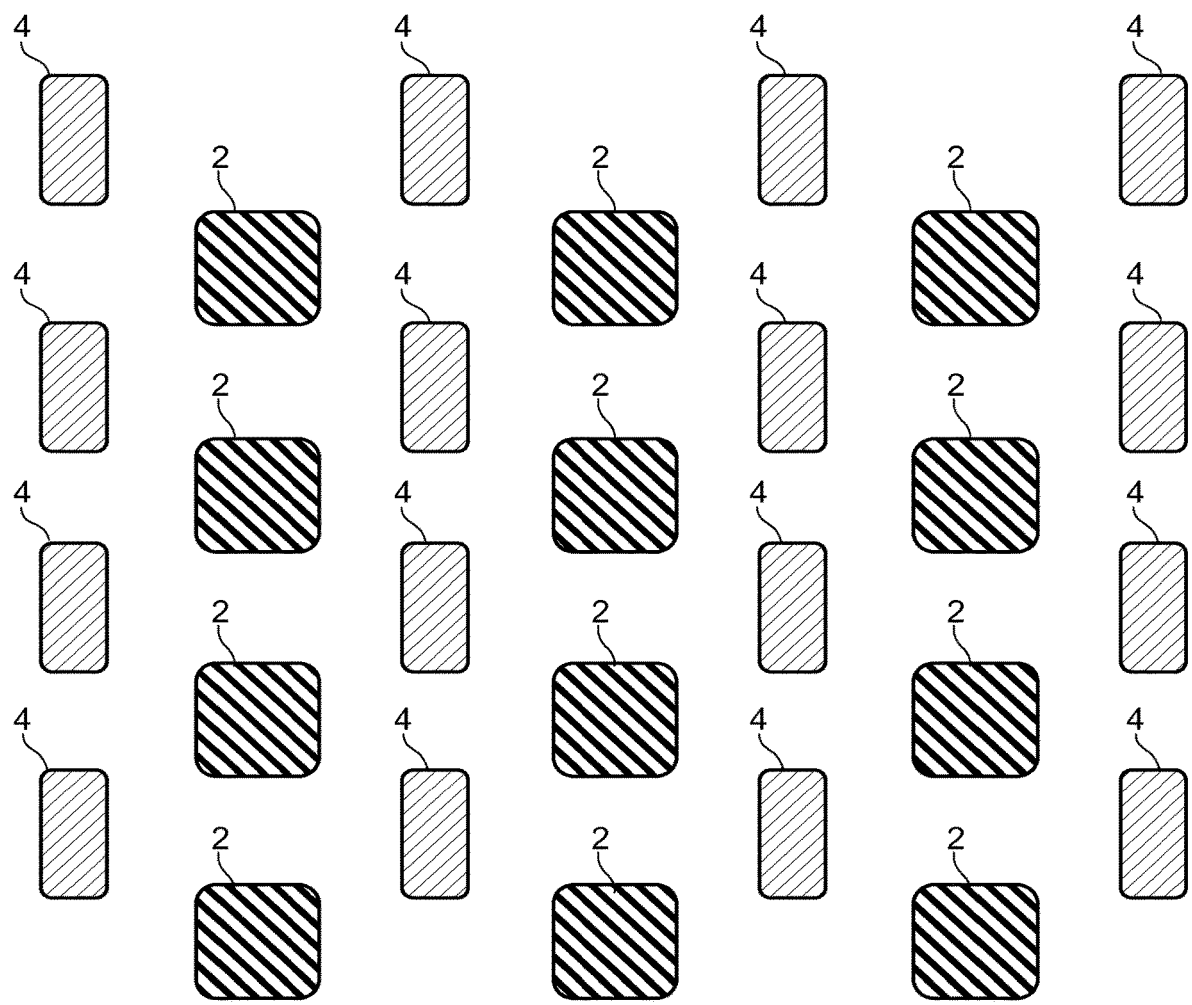
Figure 1E:
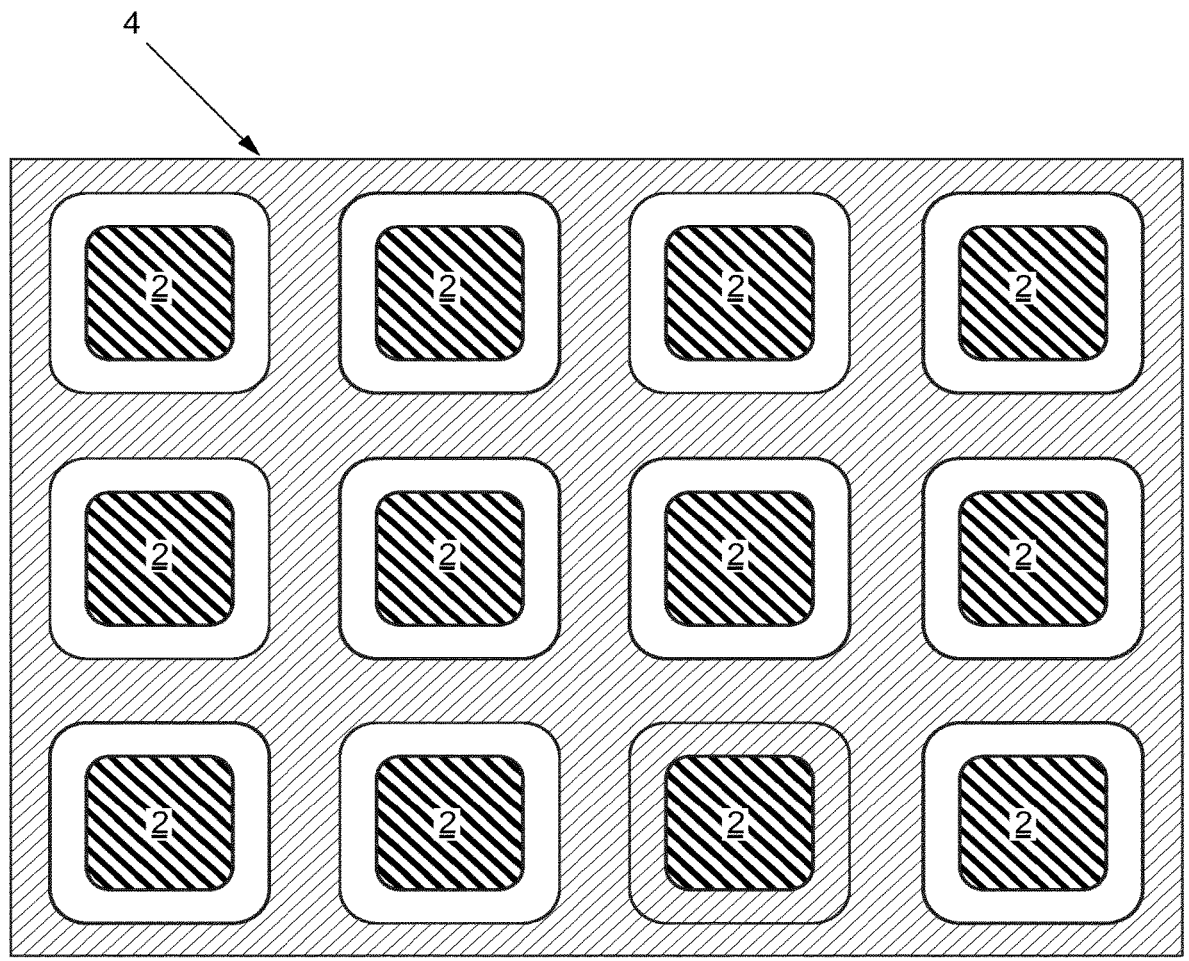
Figure 1F:
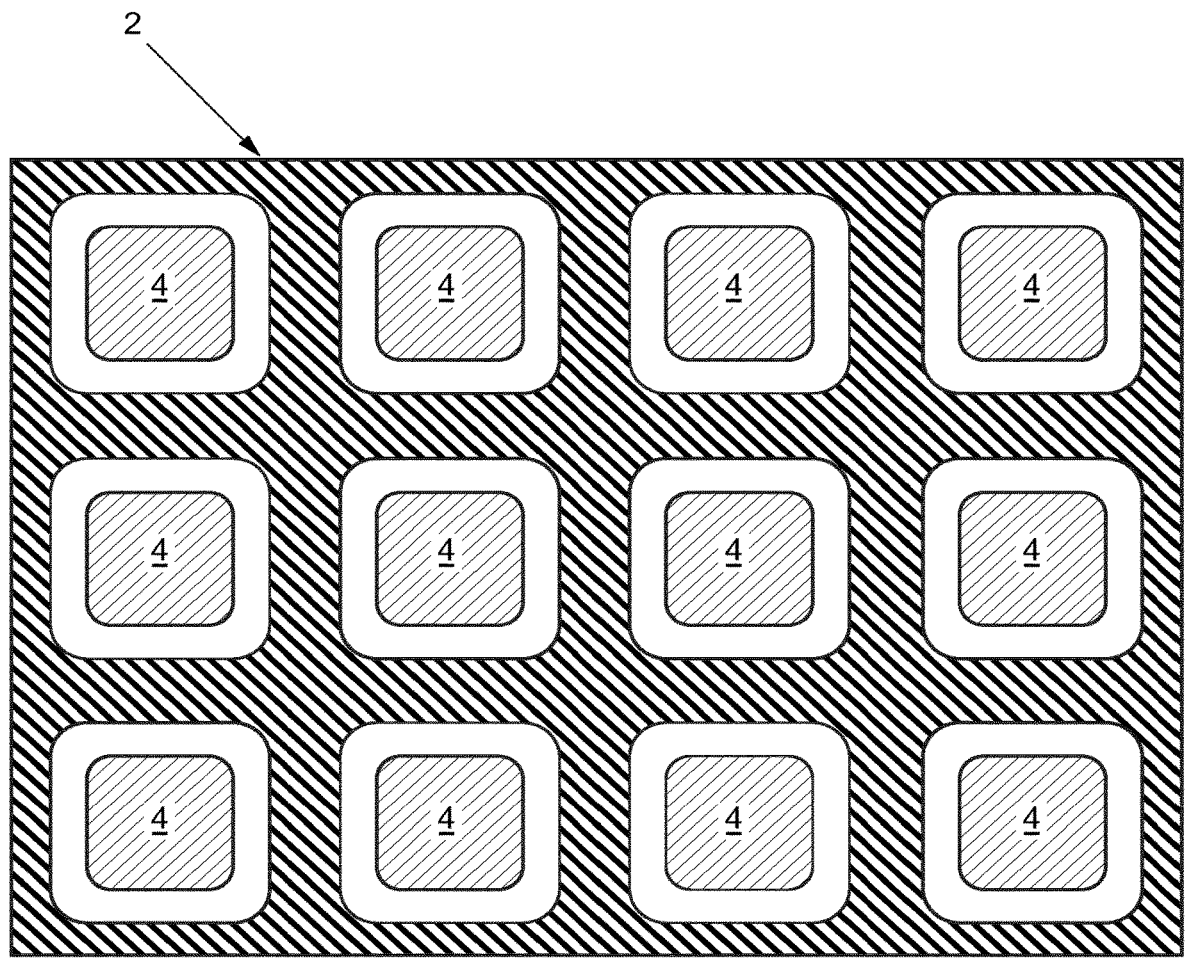
Figure 1G:
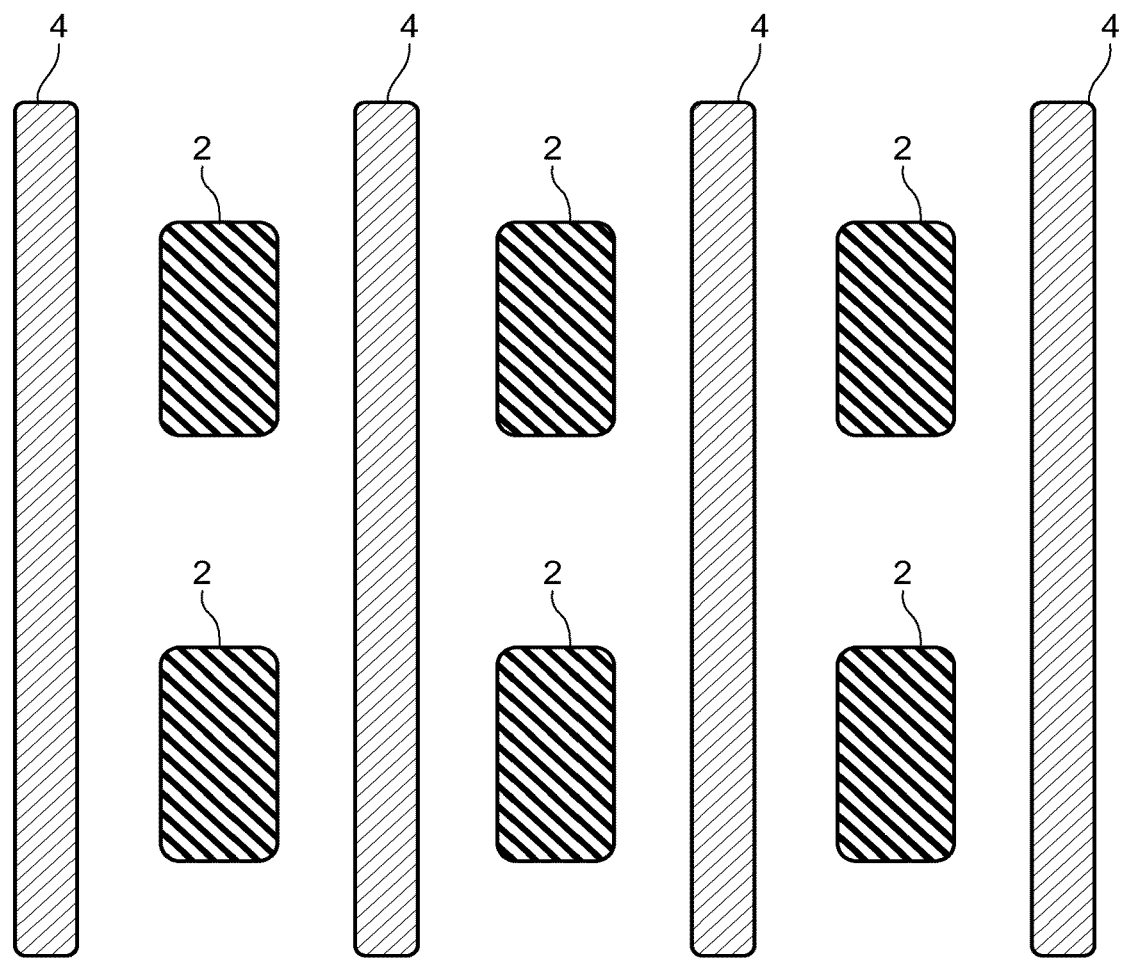
Figure 1H:
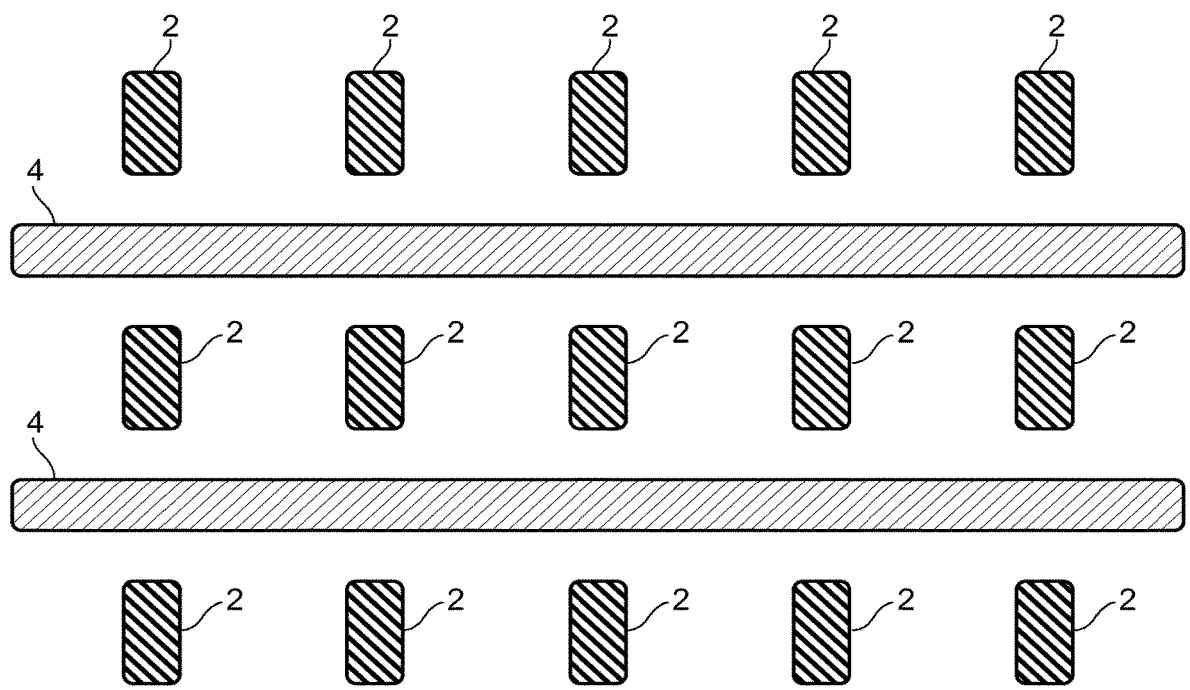
Figure 1I:
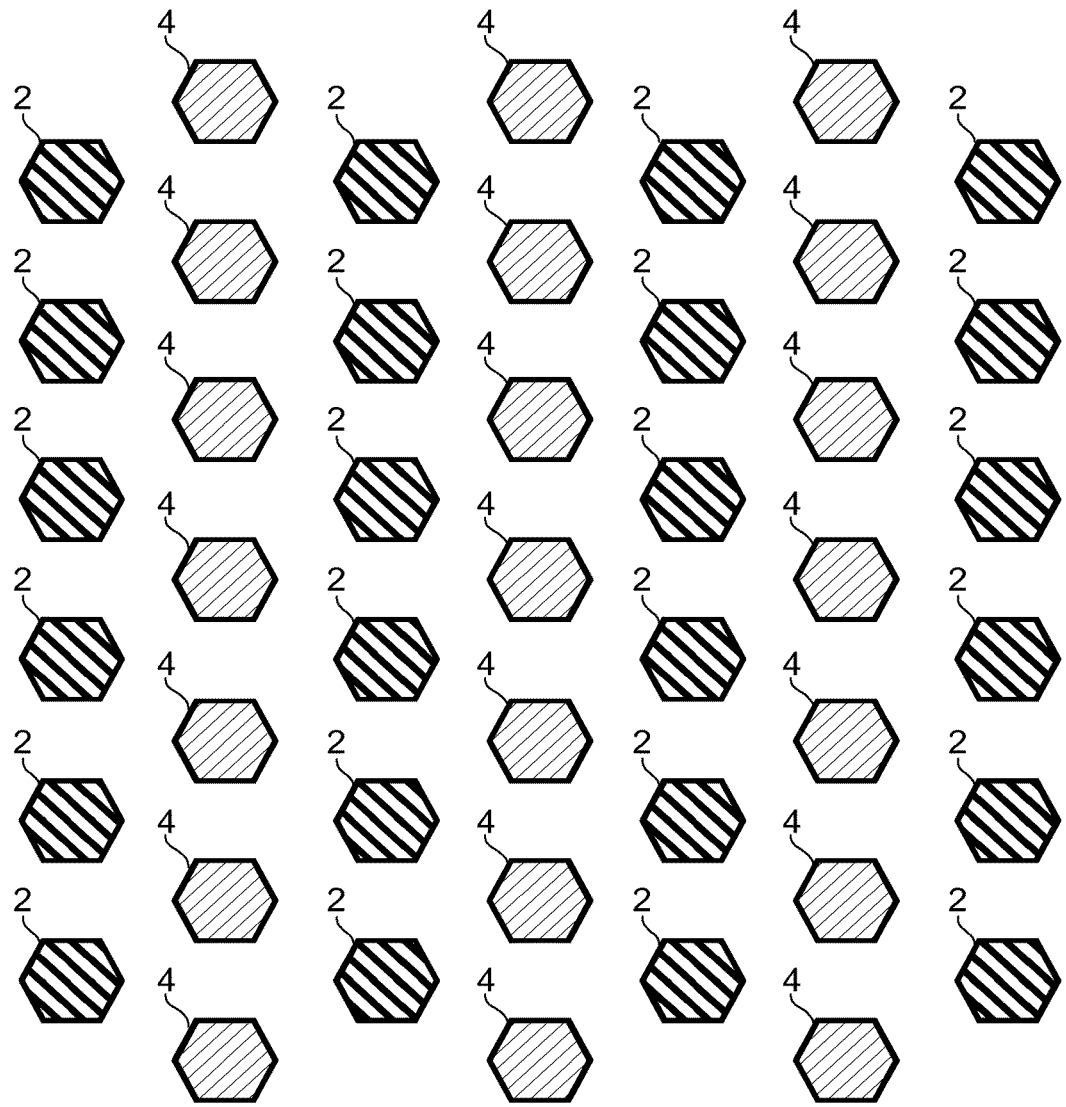
Figure 1J:
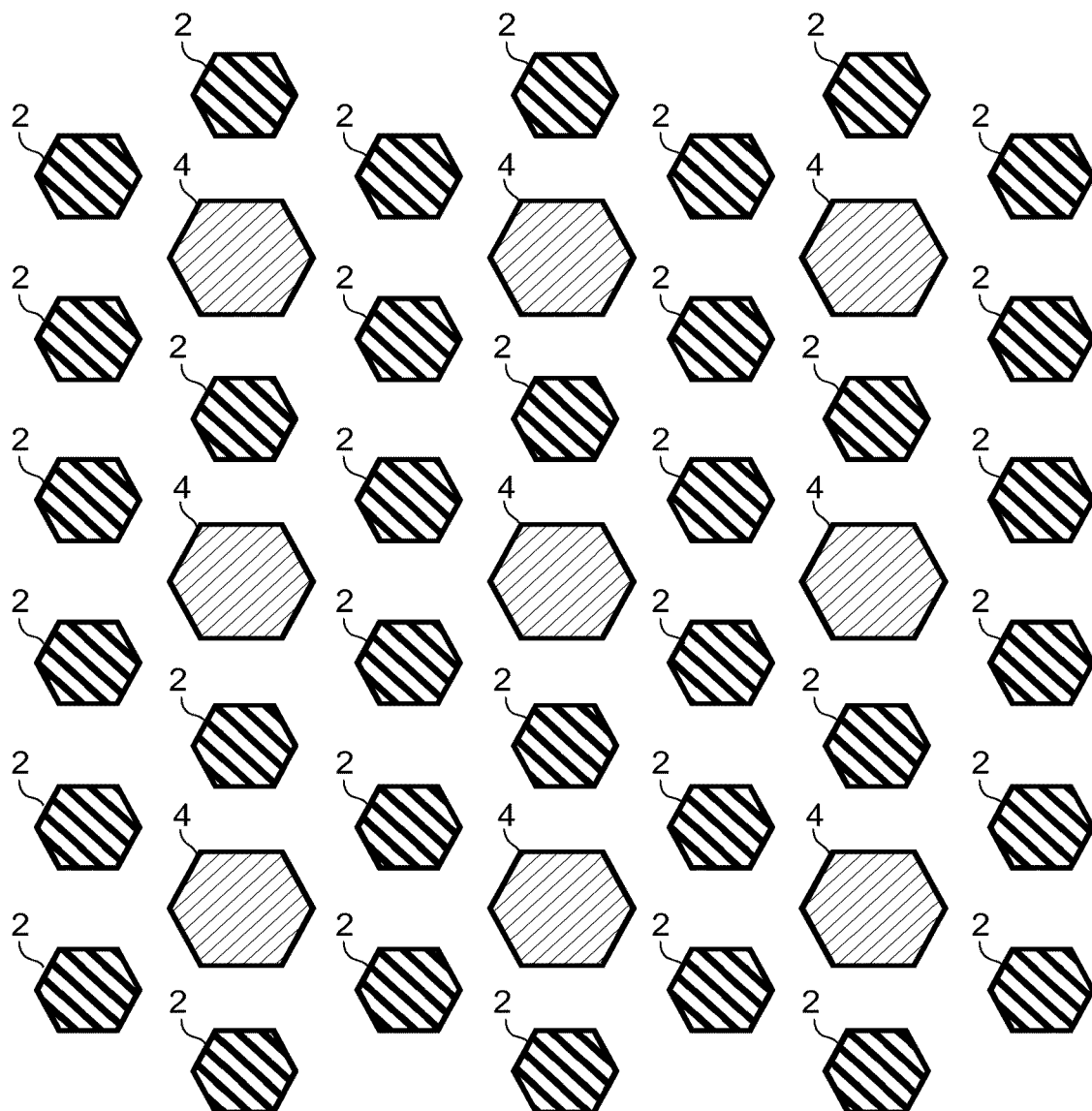
Figure 1K:
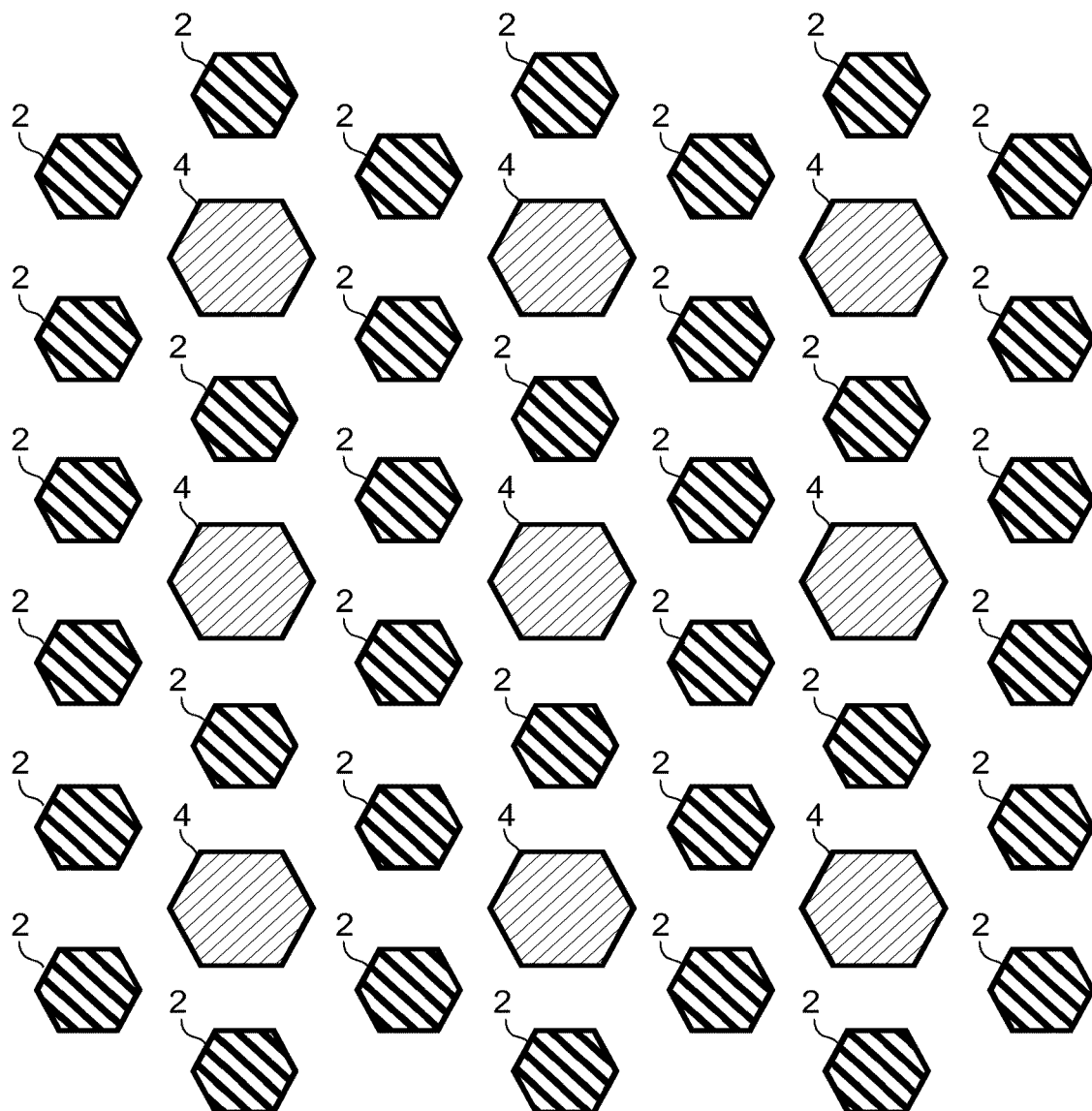
Figure 1I:
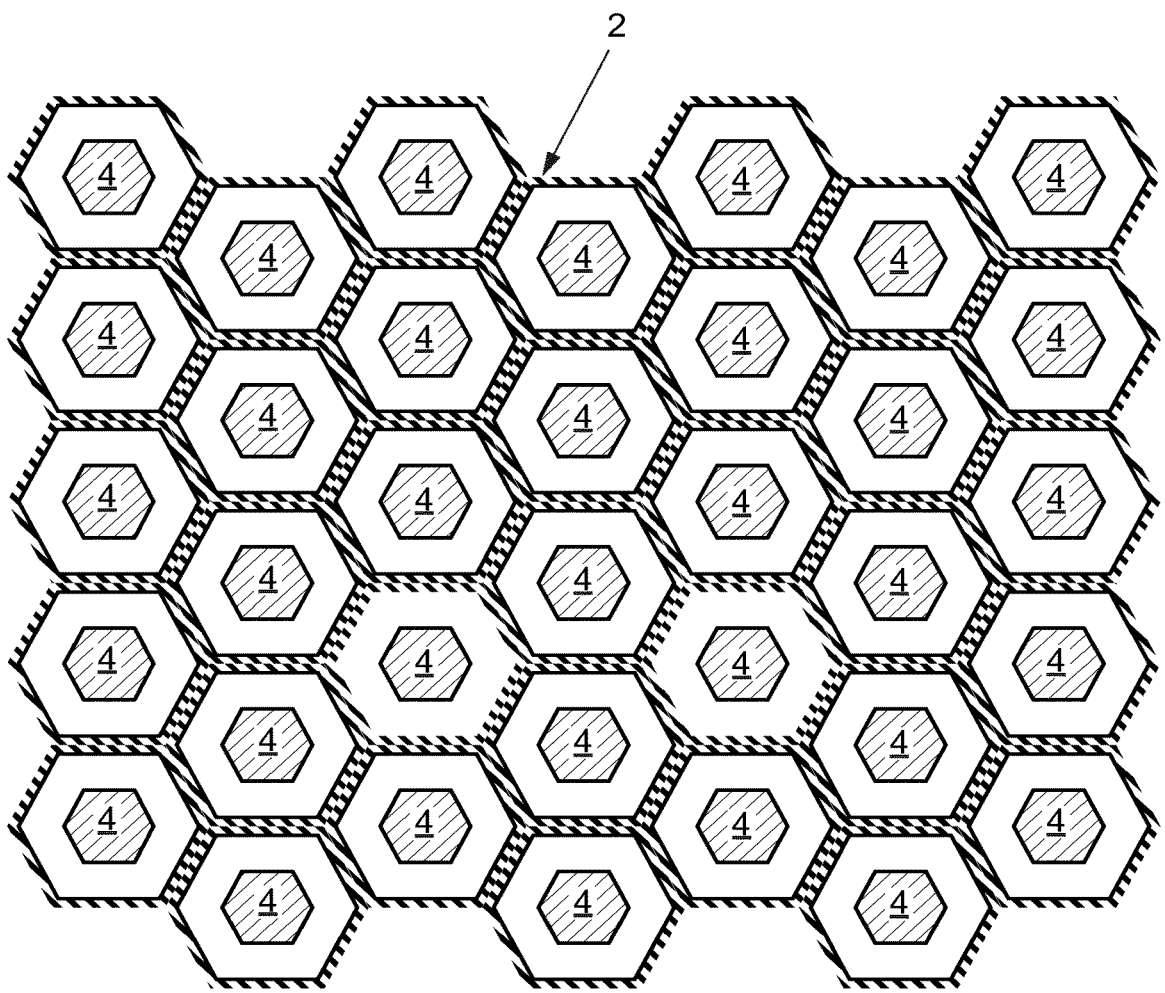
Figure 1M:
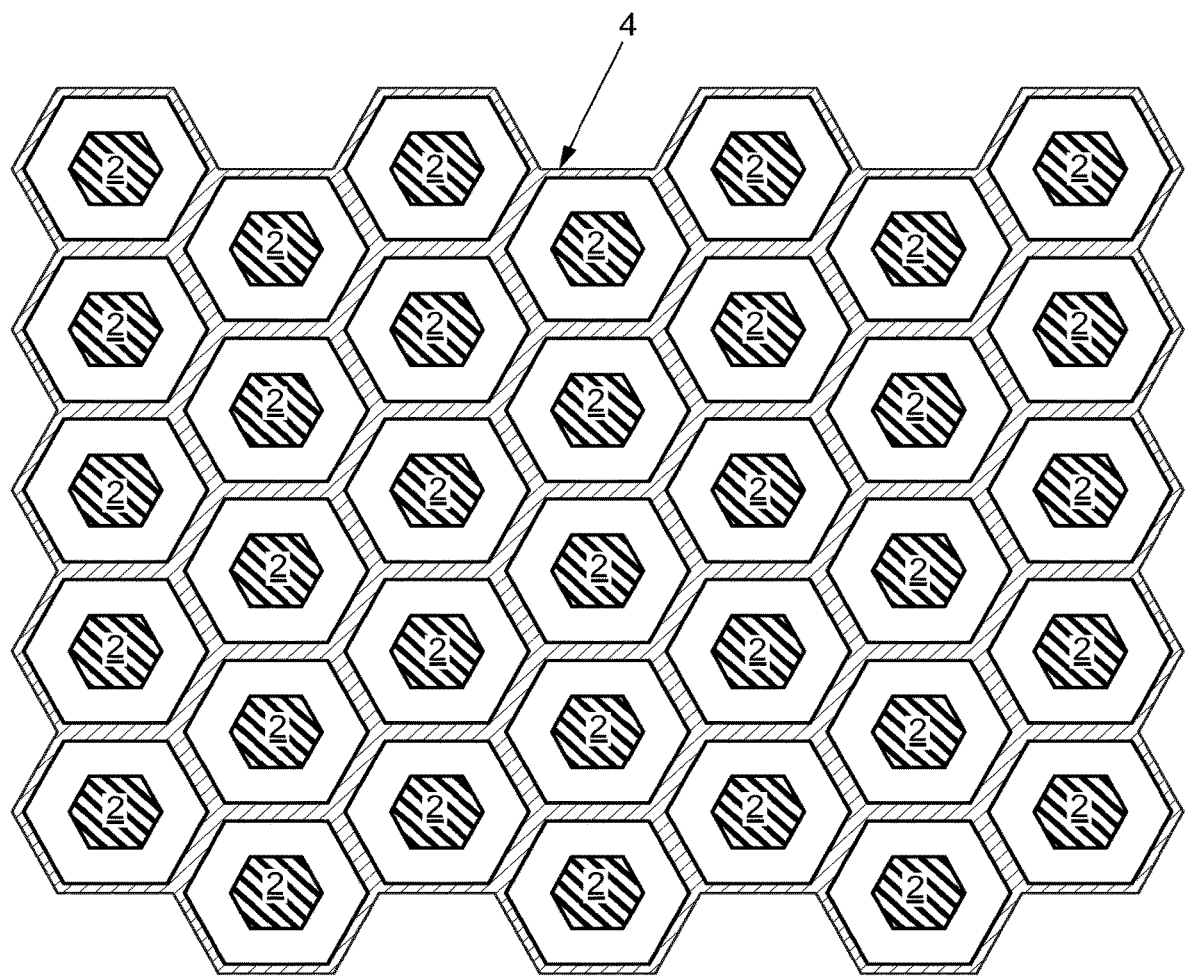
Figure 1N:
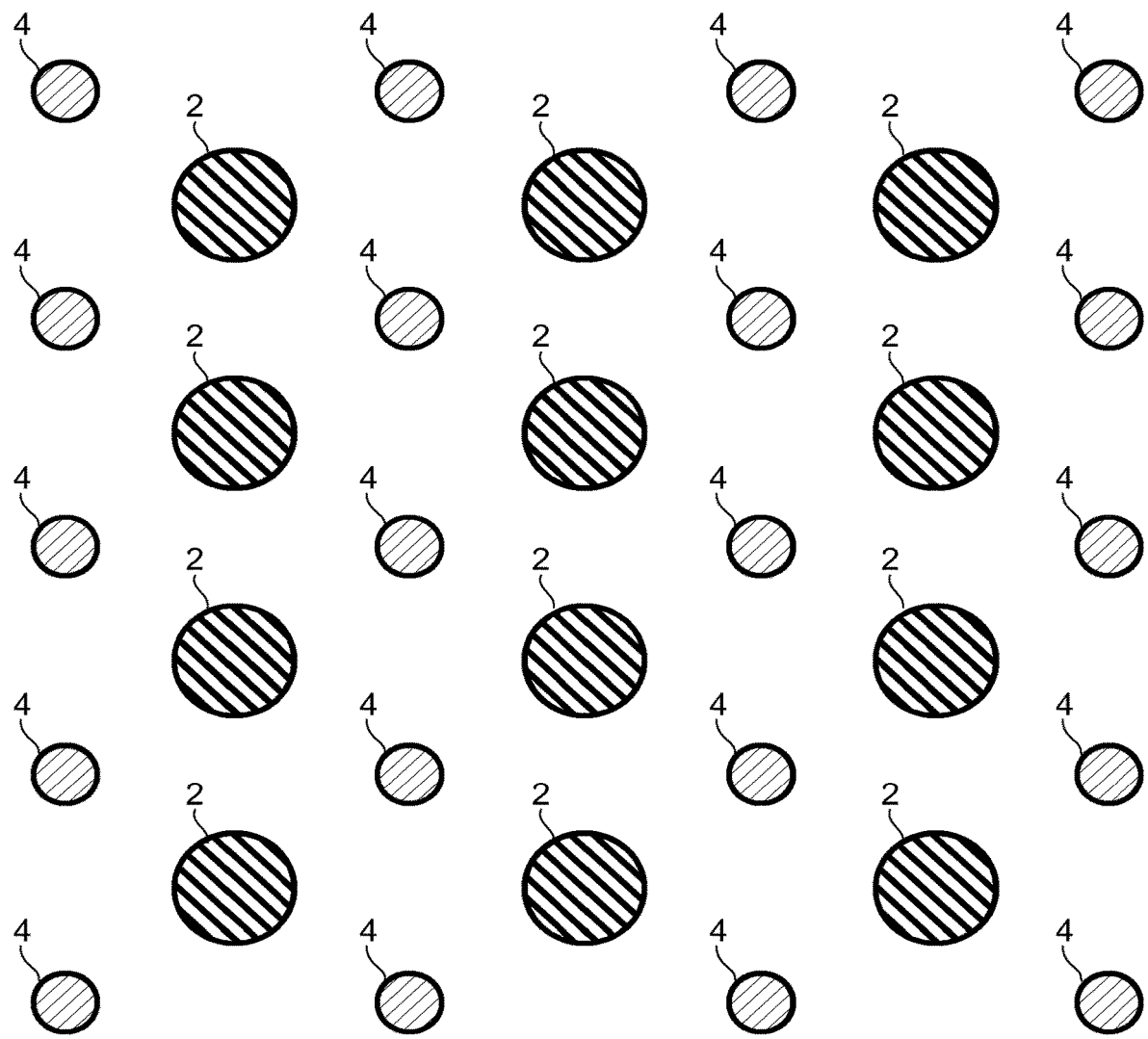
Figure 1O:
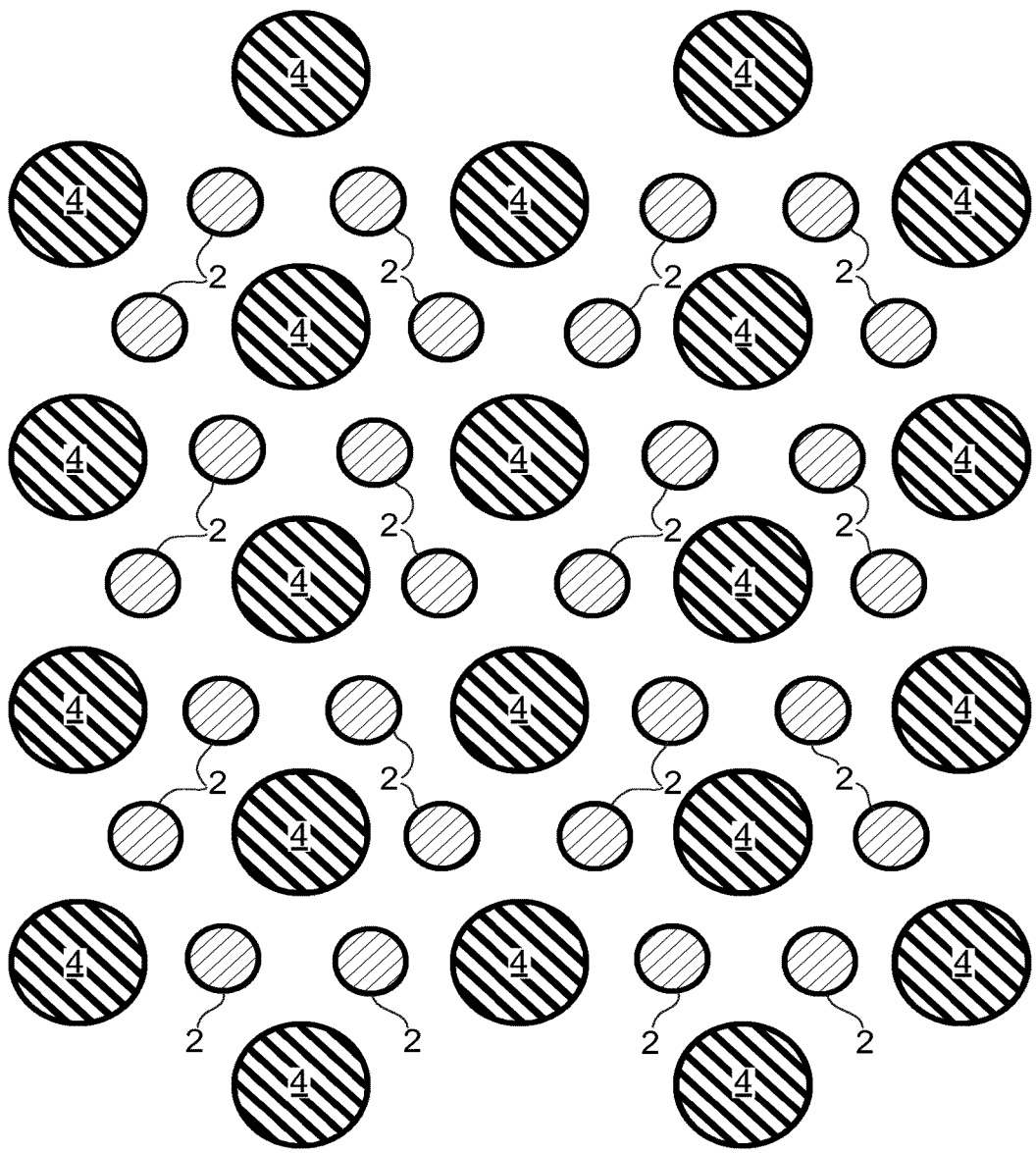
Figure 1P:
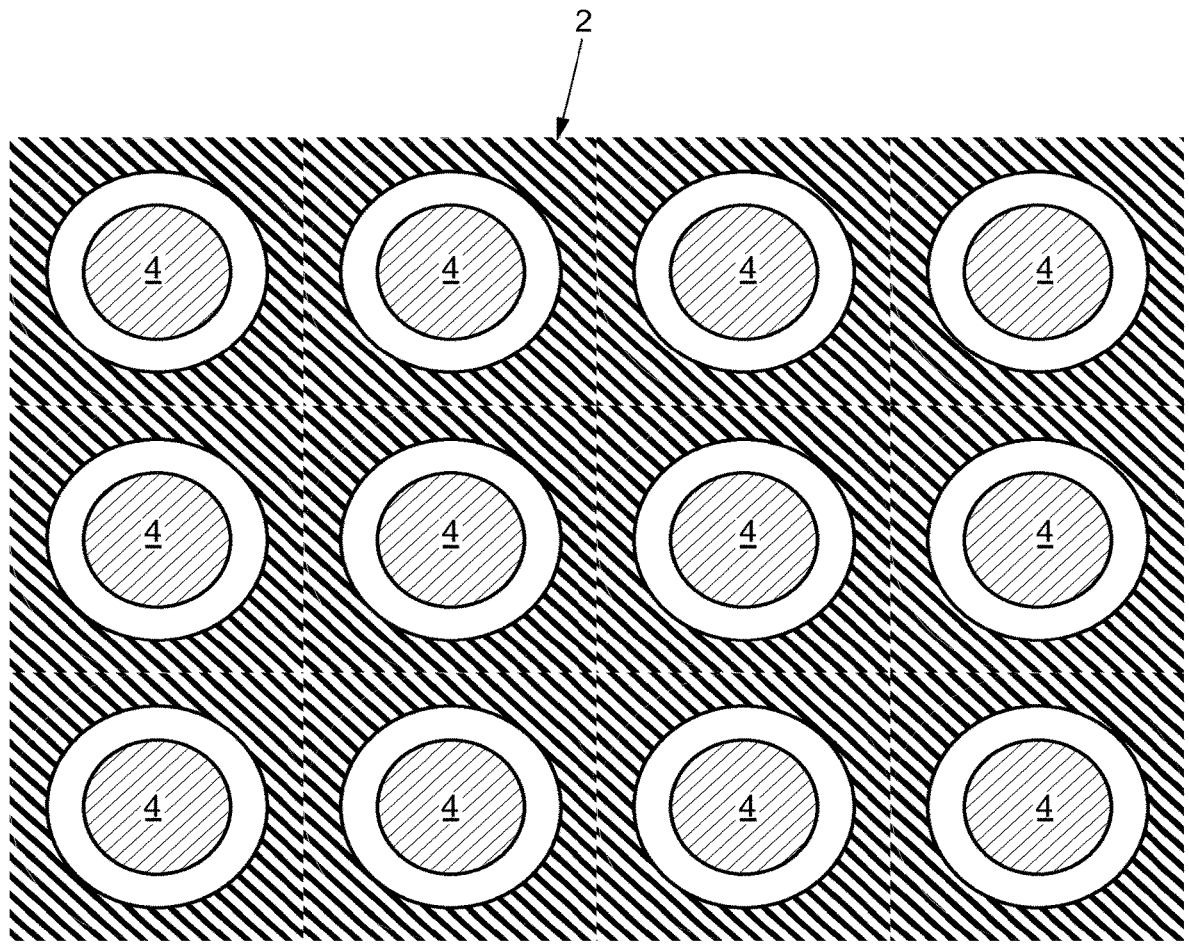
Figure 1Q:
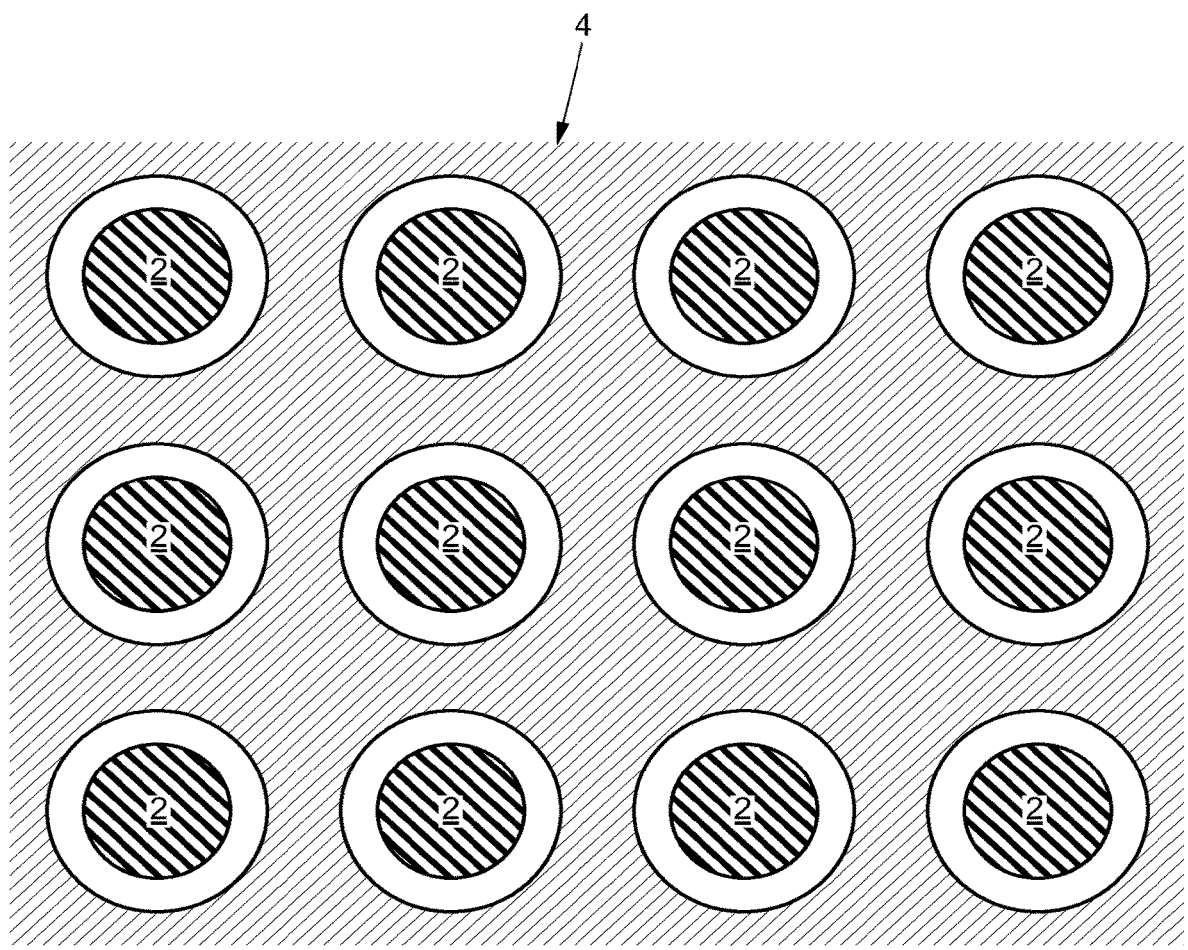

FIGS. 1a-1q illustrate a number of different embodiments of the invention, where a projection (p) in a plane parallel to a layer of wide band gap materials is shown. The projection of a buried grid (2) is shown relative to the projection of shield(s) (4).

Figure 2A:
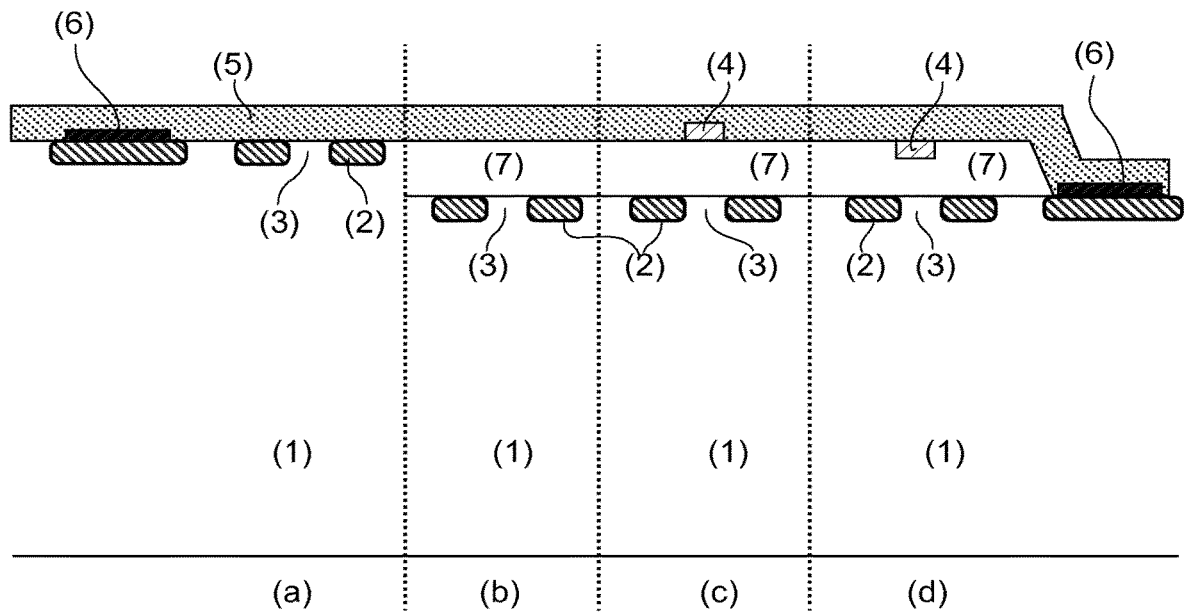
FIG. 2a shows cross-sectional views of: a conventional JBSD (panels a and b); and a BG-JBSD with a structure according to the invention (panels c and d). Both a shielding insulator on top of a semiconductor surface (panel c) and a trench filled with shielding insulator (panel d) are shown. A Schottky metal (5) is shown. The cross section is perpendicular to the layer.

FIG. 2a shows cross-sectional views of a conventional JBSD (panels a and b) and a BG-JBSD with a structure according to the invention (panels c and d). Both a shielding insulator on top of a semiconductor surface (panel c) and a trench filled with shielding insulator (panel d) are shown. A Schottky metal (5) is shown. The cross section is perpendicular to the layer.

Figure 2B:
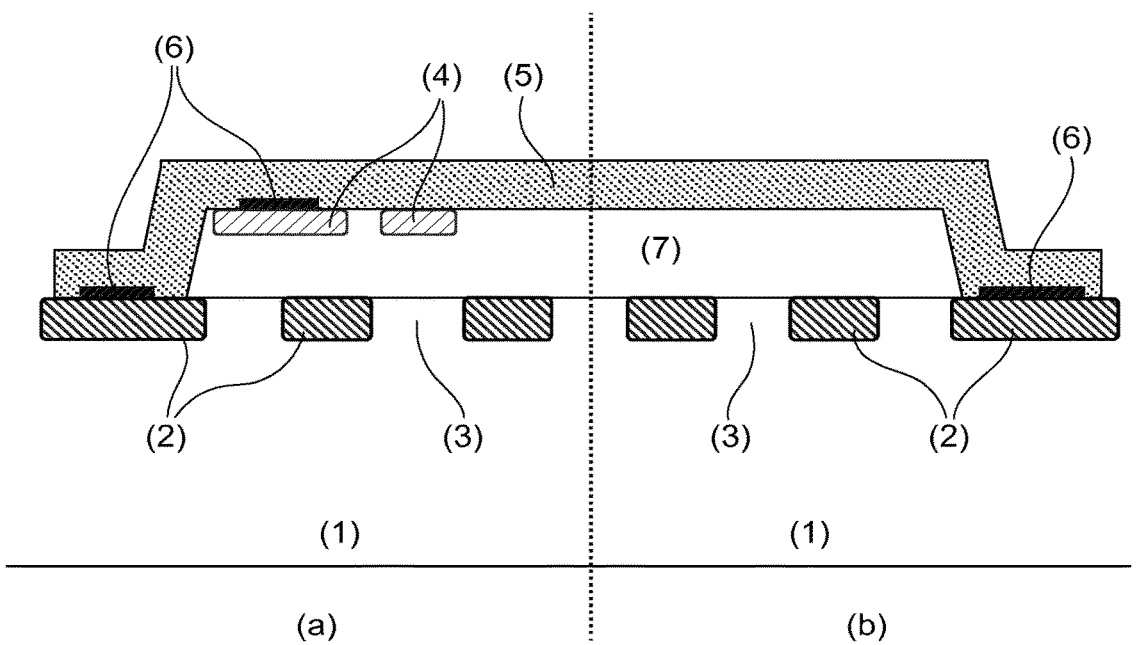
FIG. 2b shows cross sectional views of a comparison of a JBS rectifier with a combination of surface and buried grids (panel a) and a conventional BG-JBSD (panel b). There is shown an Ohmic contact (6) on top of a shield (4). A Schottky metal (5) is shown. The cross section is perpendicular to the layer.

For its part, FIG. 2b shows cross sectional views of a comparison of a JBS rectifier with a combination of surface and buried grids (panel a) and a conventional BG-JBSD (panel b). There is shown an Ohmic contact (6) on top of a shield (4). A Schottky metal (5) is shown. The cross section is perpendicular to the layer.

In a first aspect, there is provided a structure in a wide band gap material comprising a layer, where directions above and below are defined in relation to the layer. The layer comprises a buried grid (2) being a regularly spaced pattern of parts (2) of doped wide band gap material of a first conductivity type (p or n). The buried grid (2) comprises spaces (3) so that the buried grid (2) is foraminous. The spaces (3) comprise doped wide band gap material of an opposite conductivity type (n or p). The doped wide band gap material of the same conductivity type (n or p) as the spaces (3) is disposed directly above (7) and below (1) the layer, as shown in FIGS. 2a-2b. At least one shield (4) covers at least a middle point between two adjacent parts of the buried grid (2), when viewed in a projection as in FIGS. 1a-1q in a plane parallel with the layer comprising the buried grid (2).

For instance in FIGS. 2a-2b, above is up and below is down in the drawings.

The buried grid (2) has some kind of regular pattern with the spaces (3). The layer with the buried grid (2) is perforated by the spaces (3) so that the buried grid (2) is not an entirely covering layer. The buried grid (2) is made of parts (2) with the spaces (3) in-between. The buried grid (2) is in the layer.

It is conceived that the wide band gap material can be doped with conductivity type p or n.

The projection of FIGS. 1a-1q is a projection in a plane. The plane is a plane parallel with the layer of the wide band gap materials.

In one embodiment, the shields (4), when viewed in the projection (p) of FIGS. 1a-1q, are positioned at least in a surrounding points around where the electrical field would have a maximum if a voltage would be applied between conducting layers above and below the layer. The maximum of the electrical field is considered in a plane above the layer and parallel to the layer. A skilled person can make a calculation of the electrical field applied between two conducting layers above and below the layer and see where the maximum occurs. Alternatively, a skilled person knows that, for a symmetrical structure, the maximum occurs in the middle of the spacing as seen from above (in the projection (p) of FIGS. 1a-1q) and hence the middle part of the spacing should be shielded. When determining the point(s) where an electrical field would have its maximum it is not necessary to actually apply an electrical field over the part. It can be imagined to apply an electrical field over the layer as if a conducting layer would be above the layer and another conducting layer would be below the layer. Then, an electrical field can be calculated around the buried grid (2) and in the spaces (3).

In one embodiment, the shields (4) when viewed in the projection (p) of FIGS. 1a-1q are positioned so that the shields (4) cover at least a middle point of a straight line drawn between adjacent parts of the buried grid (2). Such straight lines can be drawn in the projection (p) of FIGS. 1a-1q across the spaces (3) from points between adjacent parts of the buried grid (2). It is conceived that the middle point of all possible lines can be covered by the shields (4) (in the projection (p) of FIGS. 1a-1q).

In one embodiment, the shields (4) are positioned above the layer.

In one embodiment, the shields (4) are at least partially positioned in the same plane as the layer, but not in contact with the buried grid (2). In addition, combinations of shields above the layer and in the same plane as the layer are encompassed.

In one embodiment, the shields (4) comprise an insulating material.

In one embodiment, the shields (4) comprise doped wide band gap material of the same conductivity type (p or n) as the buried grid (2). The embodiment where the shields (4) comprise doped wide band gap material has the effect that a space charge region is created around the shield contributing to the shielding effect.

In one embodiment, at least one shield (4) comprise a plurality of regions comprising a doped wide band gap material of the same conductivity type (p or n) as the buried grid (2), wherein the at least one shield (4) is foraminous. This embodiment is possible when the shields (4) comprise doped wide band gap material because of the shielding effect. In one embodiment, a shield (4) is split up into two separate shields with one small space in between.

In one embodiment, at least one of the shields (4) comprise a doped wide band gap material of the same conductivity type (p or n) as the buried grid (2), and wherein at least one ohmic contact (6) is on said at least one of the shields (4). In such an embodiment, parts of the Schottky metal (5) is on the ohmic contact (6), and thus in electrical contact with the shield.

In one embodiment, the smallest size of any one of the shields (4) in any direction in the projection (p) is 0.3 µm or larger. Seen from above, i.e. in the projection (p) of FIGS. 1a-1q, the shields (4) are larger than 0.3 µm in this embodiment. In one embodiment, the size of the shields (4) in any direction in the projection (p) is in the interval 0.3-5 µm.

In one embodiment, the height of any of the shields (4) measured perpendicular to the layer is at least 20 nm, preferably at least 50 nm. For shields thinner than 20 nm, tunneling effects become significant so that the function of the shields (4) is not efficient. Height is defined in the direction perpendicular to the substrate surface.

In one embodiment, the height of the buried grid (2) measured perpendicular to the layer is in the interval 0.3-2 µm. The height is measured in a cross section perpendicular to the layer. In one embodiment all parts of the buried grid (2) have the same height.

In one embodiment, the smallest size of the buried grid (2) in any direction in the projection (p) of FIGS. 1a-1q is in the interval 0.3-4 µm.

In one embodiment, the size of each of the spaces (3), in any direction in a projection of spaces (3) in a plane parallel with the layer is in the interval 0.3-10 µm.

In one embodiment, the wide band gap material is selected from the group consisting of silicon carbide, diamond, gallium oxide, and gallium nitride. In one embodiment, the wide band gap material is silicon carbide.

In one embodiment, the structure has been manufactured in a process comprising epitaxial growth of the wide band gap material.

In a second aspect, there is provided a method of designing a structure for a wide band gap material, said method comprising the steps of:
  designing a layer comprising a buried grid (2) and spaces (3),
  calculating the electric field around the buried grid (2) assuming that a voltage potential difference occurs over the layer, and
  positioning shields (4) where the electric field exceeds a defined value in a plane above the layer.

Designing the buried grid (2) involves determining its pattern, height, and lateral dimensions considering the intended use. When the buried grid (2) is designed, the electric field can be calculated assuming that a voltage is applied over the buried grid. Suitable it can be assumed that conducting layers are below and above the structure and that a voltage is applied between those so that an electric field arises over the buried grid (2). Once the electric field around the buried grid (2) is calculated, the shields (4) can be positioned where the electrical field exceeds a defined and suitable value.

In one embodiment, the method is implemented on a computer.

In one embodiment, a structure as described above is designed.

In a third aspect, there is provided a junction barrier Schottky diode (JBSD) comprising a structure as described above. As mentioned above various components such as JBSDs may benefit from the structures of the present invention.

Insulator regions embedded in the Schottky contact region on top of the spaces (3) between the buried grids (2) are in one embodiment implemented as shields (4) (FIG. 2 panels c and d). The insulator sustains the electric field peak in the middle of the grids (2) and shields the Schottky contact, leading to a more uniform electric field distribution (FIG. 3a).

Figure 3A:
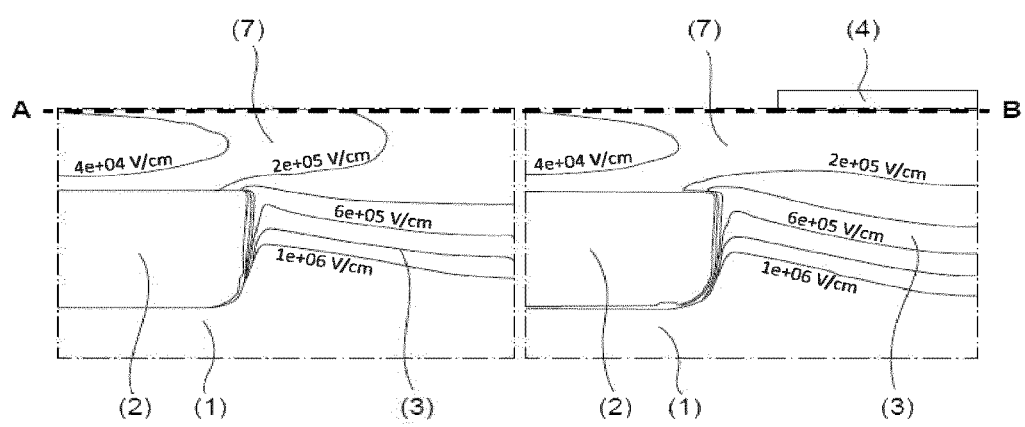
FIG. 3a shows cross sections of a calculation of the electric field distribution of a conventional BG-JBSD (left) and an identical BG-JBSD with a shielding insulator (right). The cross section is perpendicular to the layer.

In particular, FIG. 3a shows cross sections of a calculation of the electric field distribution of a conventional BG-JBSD (left) and an identical BG-JBSD with a shielding insulator (right). The cross section is perpendicular to the layer.

Figure 4A:
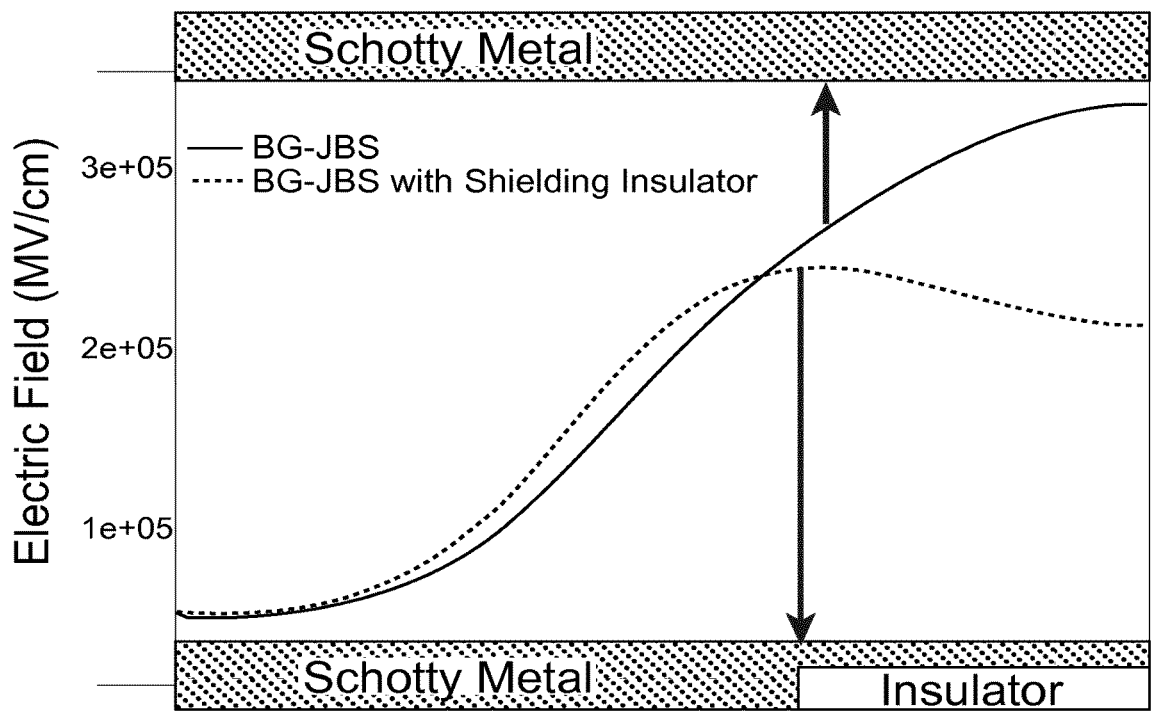
FIG. 4a in the top graph shows the simulated electric field distribution at cutline AB in FIG. 3a. The simulated forward characteristic of the conventional BG-JBSD and BG-JBSD with shields (insulation) are shown on the bottom graph of FIG. 4a. As can be seen, it is possible to optimize the shielded version to a better extent compared to the conventional version. The optimized conventional BG-JBSD is shown in solid line, a shielded BG-JBSD is shown in dotted line, and an optimized shielded BG-JBSD is shown in dashed line.
Figure 4A:
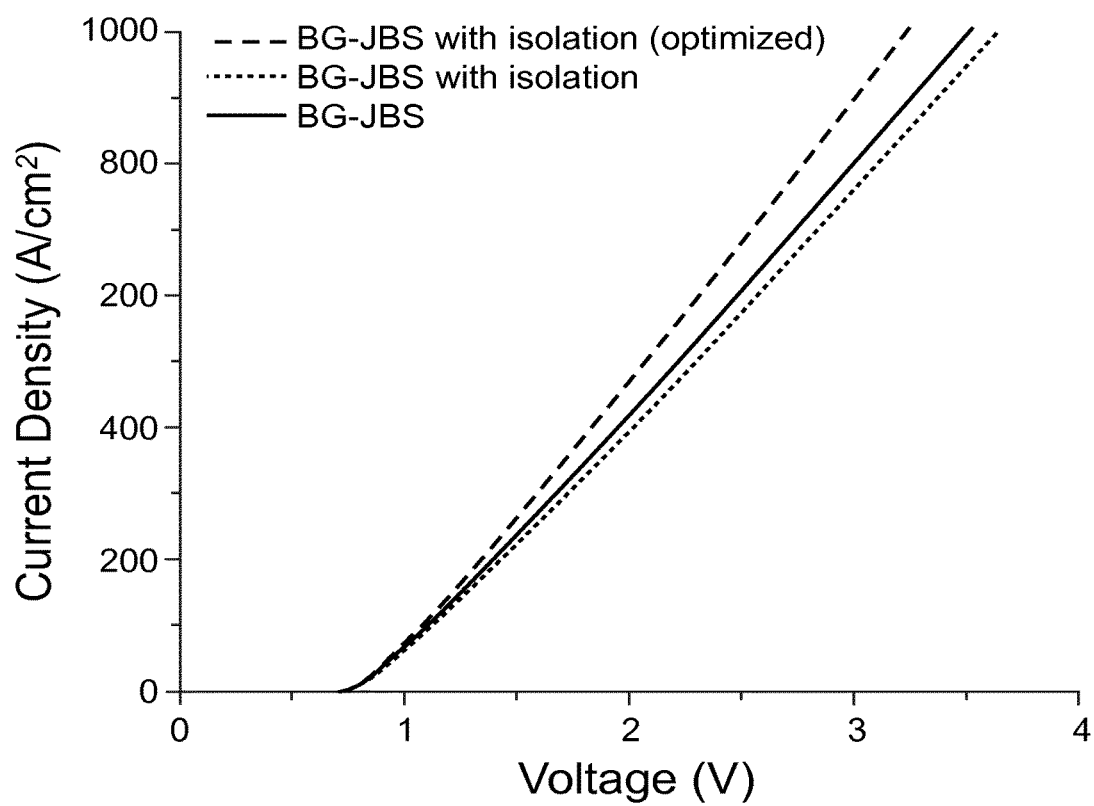

FIG. 4a in the top graph shows the simulated electric field distribution at cutline AB in FIG. 3a. The simulated forward characteristic of the conventional BG-JBSD and BG-JBSD with shields (insulation) are shown on the bottom graph of FIG. 4a. As can be seen, it is possible to optimize the shielded version to a better extent compared to the conventional version. The optimized conventional BG-JBSD is shown in solid line, a shielded BG-JBSD is shown in dotted line, and an optimized shielded BG-JBSD is shown in dashed line.

As an instance shown in FIG. 4a, by implementing an insulation layer with 1 µm width, the electric field at the Schottky contact in one particular embodiment decreases about 50% while the current density reduces by less than 5%. One can either improve the forward conduction characteristics of the device by increasing the grid spacing or channel doping etc. at similar blocking behavior, or reduce the loss and leakage current even at elevated temperatures with similar forward characteristics. Therefore, by optimizing the grids and epilayers, more than 10% higher current density can be achieved at similar electric field at the Schottky contact in one particular embodiment.

A silicon dioxide ($SiO_2$) layer is an example of the shielding insulator layer. Other insulating materials including other suitable oxides are known to persons skilled in the art.

In case of wide enough spacing between the grids or trenches, the same concept can also be implemented on the surface grid or trench grid devices as well as any other devices using the grid concept to protect electrical field sensitive device regions.

Two different version of the structures with shielding insulator are shown in FIG. 2a panel c and d. Both structures have an insulator layer acting as shielding mechanism to sustain the electric field peak in the centre of the grid spacing. The former has a simpler fabrication process while the latter provides extra protection by introduction of a trench filled with insulator with additional process steps.

Figure 5:
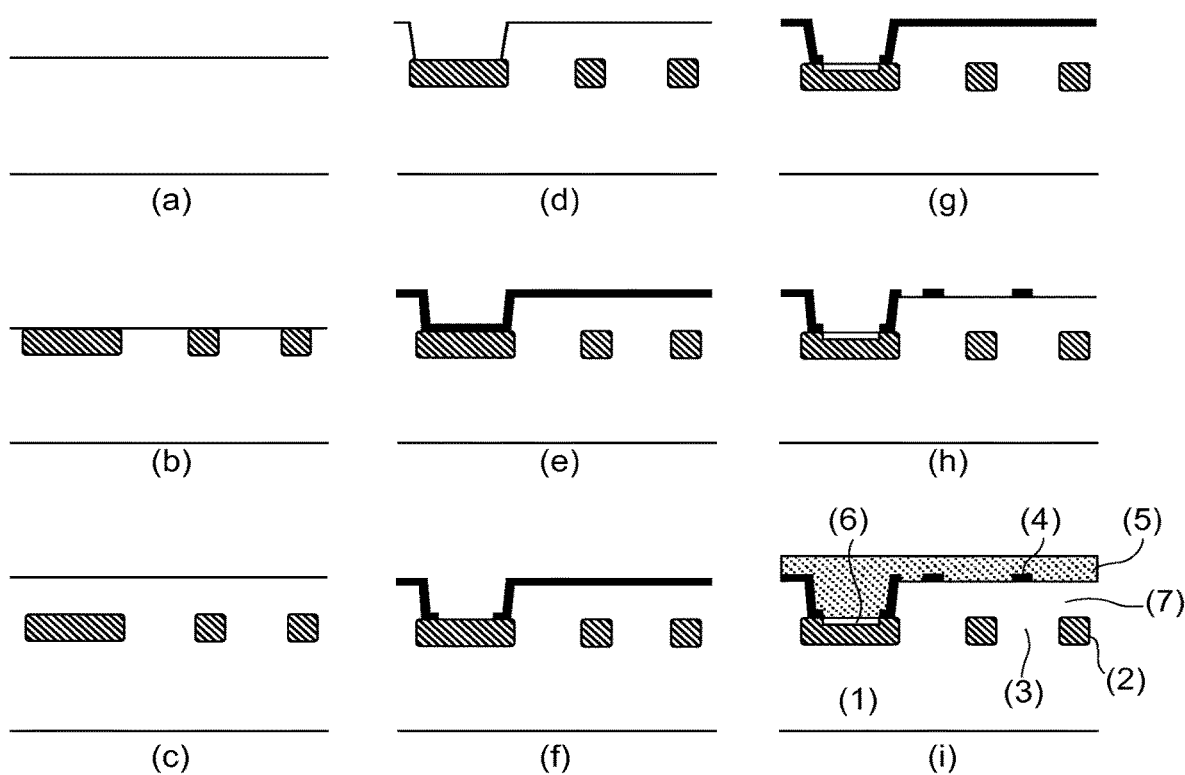
FIG. 5 in panels a-i shows a proposed manufacturing process of the BG-JBSD with shielding insulator shown in FIG. 2a panel c.
Figure 6:
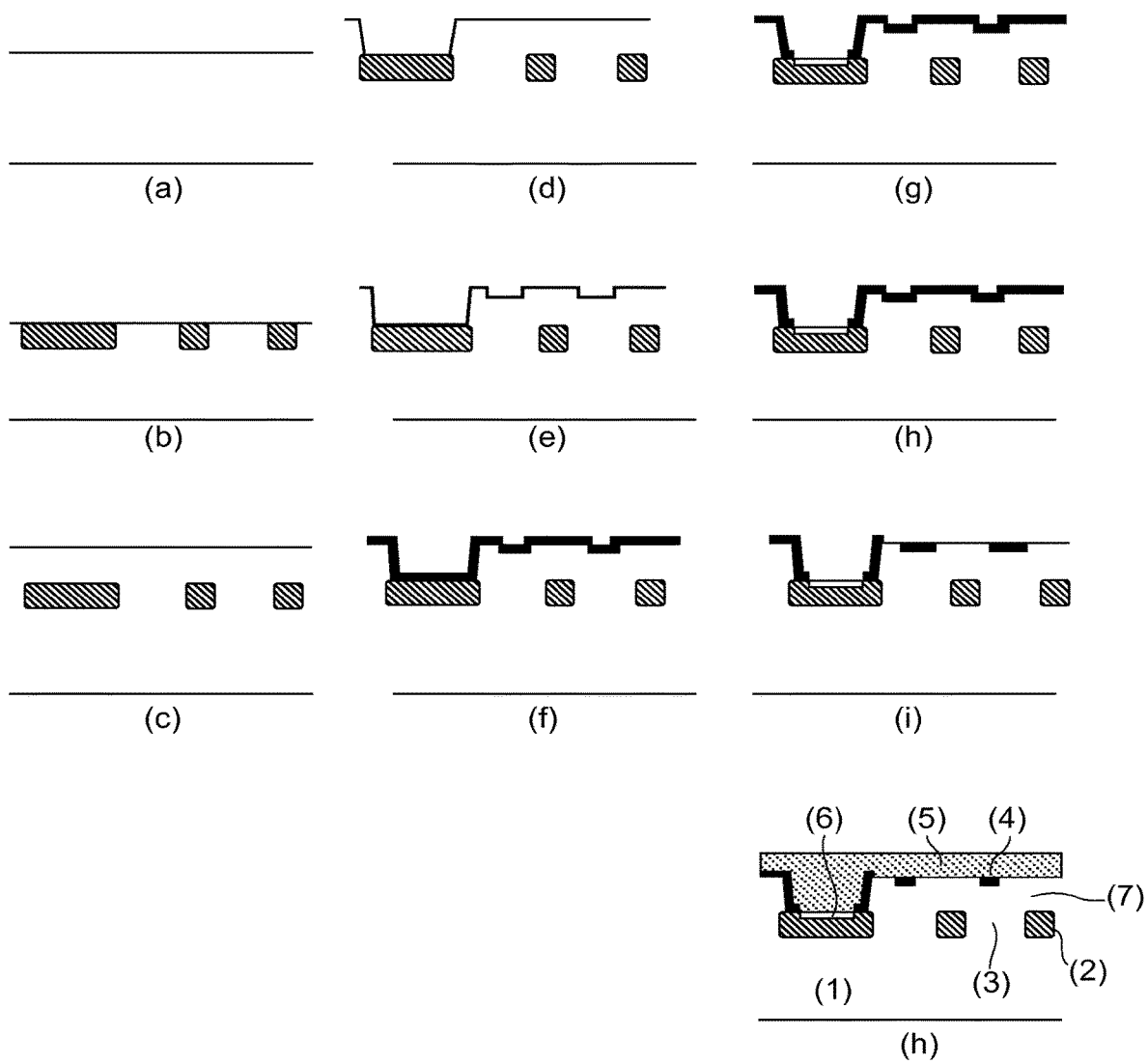
FIG. 6 in panels a-h shows a proposed manufacturing process of the BG-JBSD with etched filled shields shown in FIG. 2a panel d.

FIGS. 5 and 6 represent proposed fabrication process flows of the BG-JBSD with shielding insulator shown in FIG. 2a panel c and d. In particular, FIG. 5 in panels a-i shows a proposed manufacturing process of the BG-JBSD with shielding insulator shown in FIG. 2a panel c. Meanwhile, FIG. 6 in panels a-i shows a proposed manufacturing process of the BG-JBSD with etched filled shields shown in FIG. 2a panel d. The former has a similar process compared to the conventional BG-JBSD while the latter needs extra process steps but also provides better protection due to the trench structures. Therefore, by using the latter with trench structure, one can further improve the forward characteristics either by optimization of the grid and epilayers, or decreasing the insulator width to shrink the cell pitch. The Schottky contact can be formed by a self-aligned process formation of the shielding insulator. The width of the shielding insulator is determined by the lithography and the device targeted operation.

In one embodiment of the shielded buried grid, p+ surface grids are in the Schottky contact region of JBSDs in the center on top of the spacing between the buried grids.

Figure 3B:
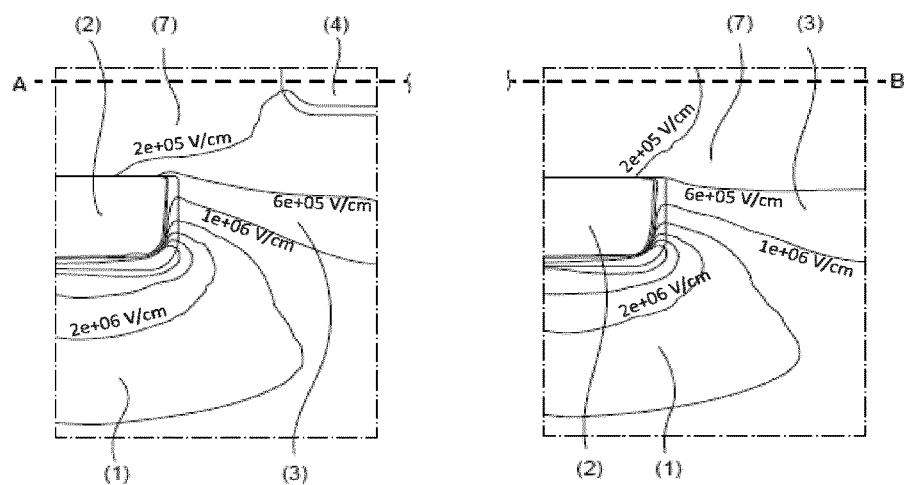
FIG. 3b shows cross sections of a calculation of the electric field distribution of a conventional BG-JBSD (right) and an identical BG-JBSD with a doped surface grid (left). The cross section is perpendicular to the layer.

By introduction of the shields (4) such as p+ surface grids in the Schottky contact region on top of the center of the spacing (3) between the buried grids (2), the p+ surface grid sustains the high electric field and shields the Schottky contact, without a significant effect on the conduction behavior of the Schottky contact. The additional shielding surface grids alleviate the electric field peaks leading to a more uniform electric field distribution (FIG. 3b). In particular, FIG. 3b shows cross sections of a calculation of the electric field distribution of a conventional BG-JBSD (right) and an identical BG-JBSD with a doped surface grid (left). The cross section is perpendicular to the layer.

A better protection for the electric field sensitive device areas enables to improve the forward conduction characteristics of the device such as a JBSD comprising the structure, without any significant effect on the voltage blocking behavior. Hence, it can either improve the forward conduction characteristics of the device by increasing the grid spacing or channel doping etc. at similar voltage blocking behavior, or reduce the losses and leakage current even at elevated temperatures with similar forward characteristics.

Figure 4B:
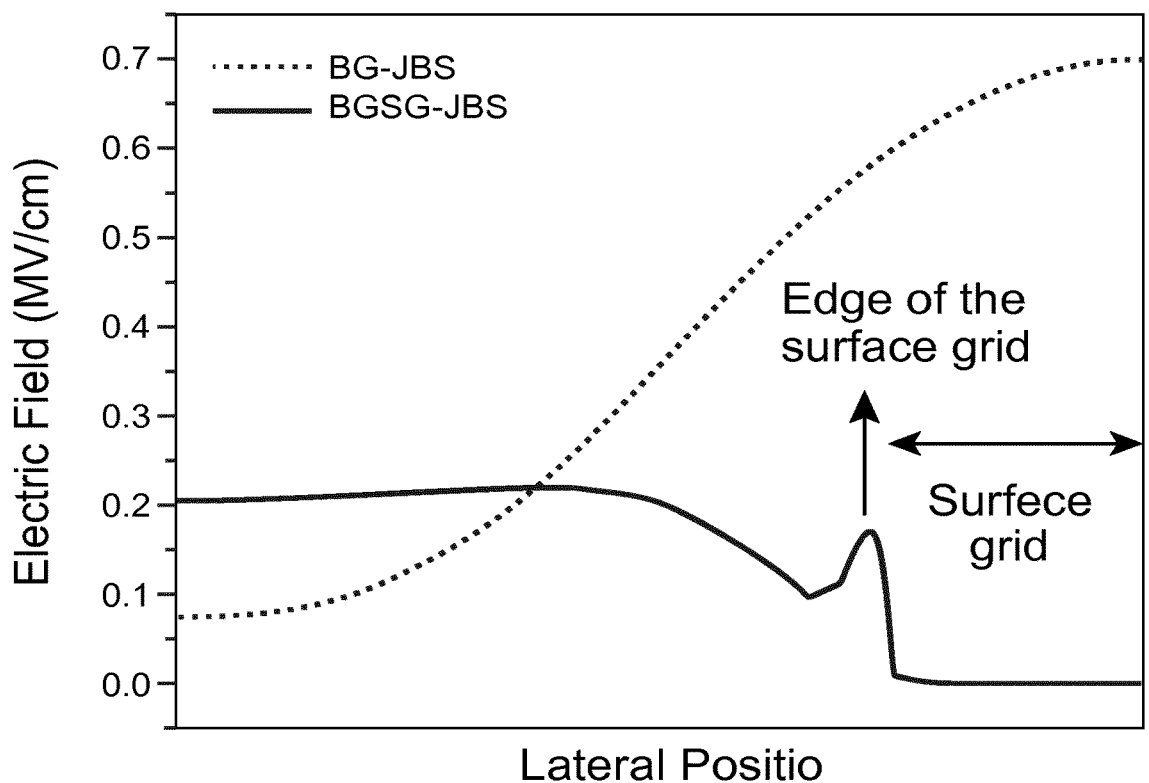
FIG. 4b shows in the top graph the simulated electric field distribution at cutline AB in FIG. 3b. The simulated forward characteristic of the conventional BG-JBSD and BG-JBSD with a doped surface grid are shown on the bottom graph of FIG. 4b. As can be seen, it is possible to optimize the shielded version to a better extent compared to the conventional version. The optimized conventional BG-JBSD is shown in dashed, a shielded BG-JBSD is shown in dotted and an optimized shielded BG-JBSD is shown in solid.
Figure 4B:
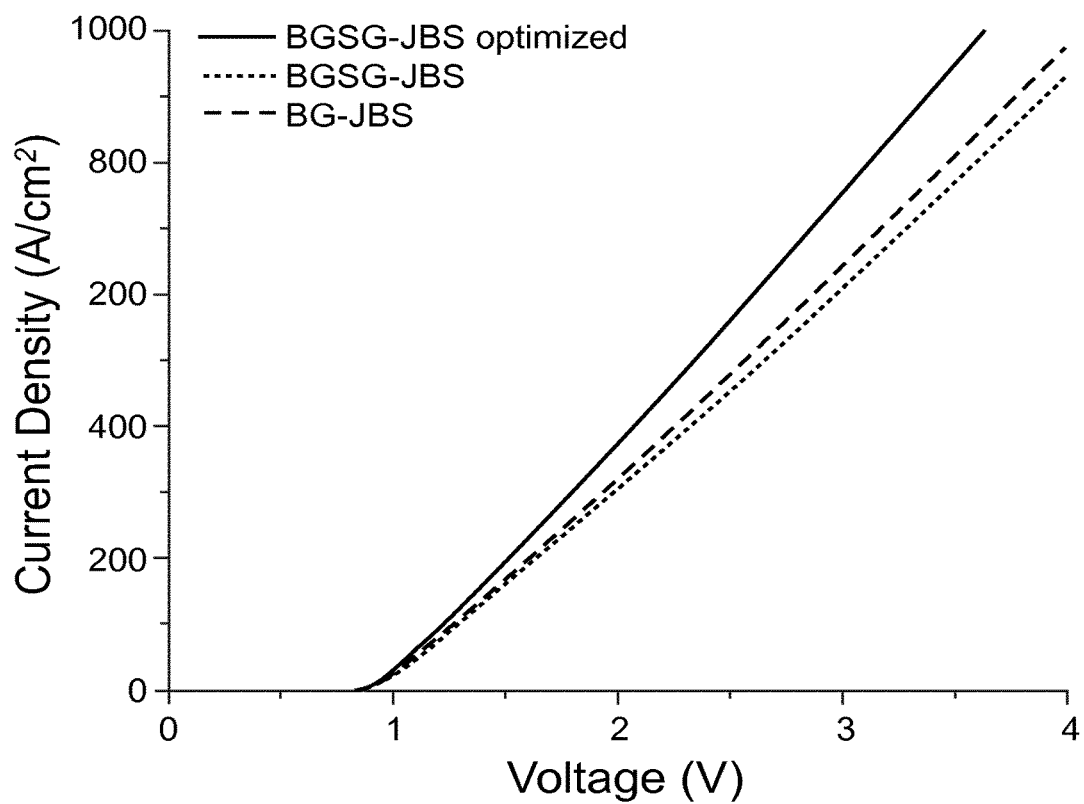

FIG. 4b shows in the top graph the simulated electric field distribution at cutline AB in FIG. 3b. The simulated forward characteristic of the conventional BG-JBSD and BG-JBSD with a doped surface grid are shown on the bottom graph of FIG. 4b. As can be seen, it is possible to optimize the shielded version to a better extent compared to the conventional version. The optimized conventional BG-JBSD is shown in dashed, a shielded BG-JBSD is shown in dotted and an optimized shielded BG-JBSD is shown in solid.

As for an embodiment shown in FIG. 4b, by implementing a doped wide band gap material layer with 0.5 μm width, the electric field at the Schottky contact decreases about 3 times while the current density reduces by less than 5%. One can either improve the forward conduction characteristics of the device by increasing the grid spacing or channel doping etc. at similar voltage blocking behavior, or reduce the loss and leakage current even at higher temperature with similar forward characteristics. Therefore, by optimizing the grids and epilayers, in one particular embodiment more than 15% higher current density can be achieved at similar electric field at the Schottky contact.

Also, the depletion regions around the p+ surface and buried grids widen the effective grid areas. One can control the widening of the grid areas by the properties of the grids such as thickness, width, and position, as well as the thickness and doping of the epilayers between the surface and buried grids to achieve an effective pinching mechanism of the channels between the grid areas. This gives blocking behavior close to the blocking characteristics of PiN diodes and very low leakage currents even at elevated temperatures.

Figure 7:
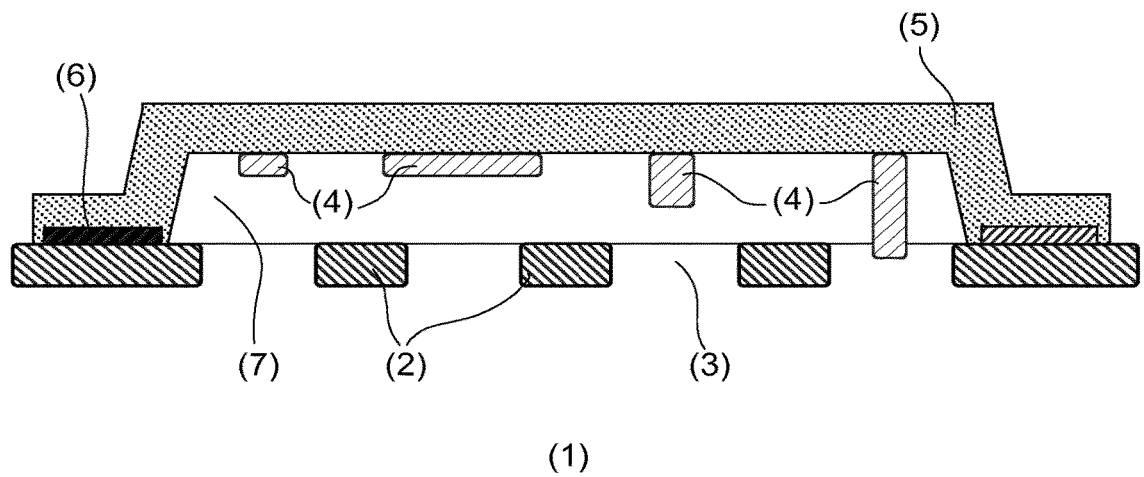
FIG. 7 shows examples of surface and buried grid profiles for a JBS rectifier. It can be seen that the shields (4) can be shaped differently. There is shown a cross sectional view taken perpendicular to the layer.

On the other hand, one can improve the surge current capability of the device by using both surface and buried grids as p− emitters with Ohmic contact formed to the grid regions. The total area of the grids with Ohmic contact, geometry, placement, and the scaling of the p+ grids can be adjusted to achieve the desirable surge current behavior of SiC JBSD rectifiers. Some examples of the different surface and buried grid profiles are shown in FIG. 7, which can be used for different applications. In particular, FIG. 7 shows examples of surface and buried grid profiles for a JBS rectifier. It can be seen that the shields (4) can be shaped differently. There is shown a cross sectional view taken perpendicular to the layer.

Some design considerations to obtain an optimum design for the electric field shielding related to desirable forward resistance are as:

The shields (4) should in one embodiment cover the center region between the buried grid spacing (3), i.e. where the electrical field is at its maximum.

The lateral dimension of the surface grid shields (4) are in one embodiment wider than 0.3 μm, preferably 0.5 μm.

Figure 8:
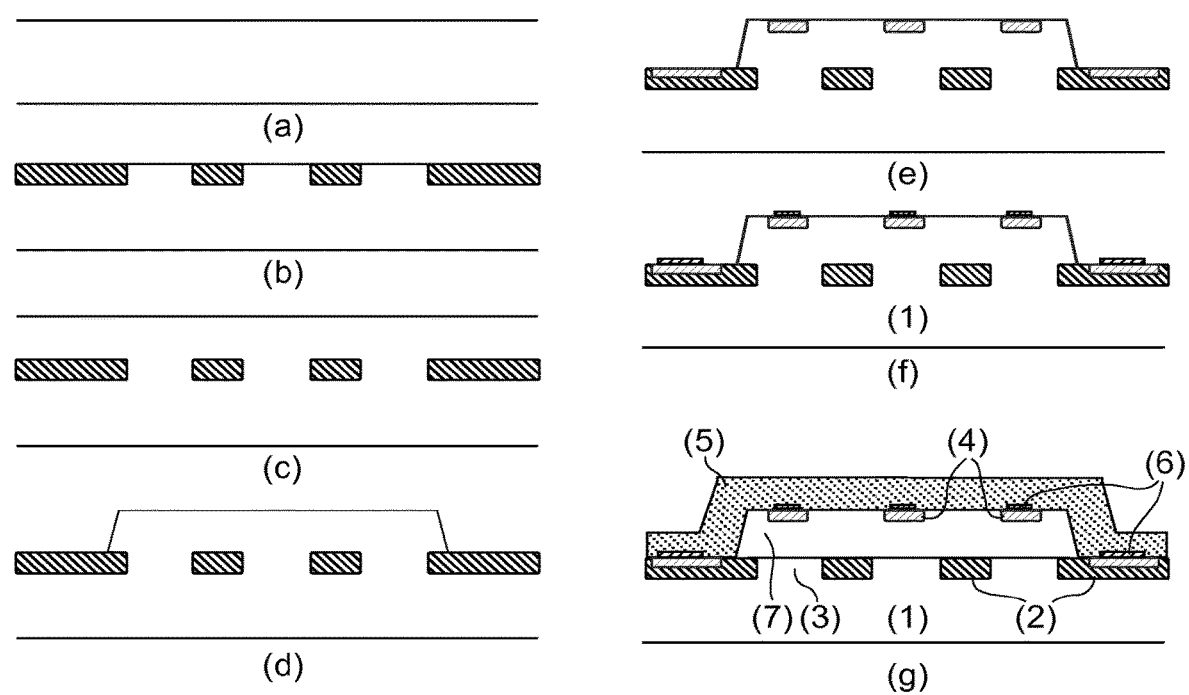

FIG. 8 in panels a-g shows a proposed manufacturing process of the JBS rectifier with shielding doped surface grid shown in FIG. 2b, panel a. FIG. 8 represents a proposed fabrication process flow of the JBSD with combined buried and surface p+ grids. The Schottky contact can in one embodiment be formed by self-aligned process of the shielding p+ surface grid. Also, a high dose p+ ion implantation is commonly used to form low resistive p− ohmic contacts to the grids to improve the injection from the grid, which one can use it to form the p+ surface grids at the same time. The width of the shielding p+ surface grid is determined by the lithography and the device targeted operation. The shielded buried grid JBS rectifier can be fabricated with similar process as BG-JBSDs with no extra lithographic or process steps.

All the described alternative embodiments above or parts of an embodiment can be freely combined without departing from the inventive idea as long as the combination is not contradictory.

Other features and uses of the invention and their associated advantages will be evident to a person skilled in the art upon reading the description and the examples.

It is to be understood that this invention is not limited to the particular embodiments shown here. The embodiments and the following examples are provided for illustrative purposes and are not intended to limit the scope of the invention.

The invention claimed is:

1. A diode device, comprising:
   a first doped type layer of wide band gap material of a first conductivity type;
   a buried grid of a second doped type of the wide band gap material of a second conductivity type opposite to the first conductivity type, the buried grid comprising a plurality of parts having portions of the first doped type layer between the plurality of parts of the buried grid; and
   a plurality of shields having portions of the first doped type layer between the plurality of shields, wherein the shields intersect a first plane and the shields intersect a projection onto the first plane of a middle point between adjacent ones of the parts of the buried grid.

2. The diode device of claim 1, wherein the plurality of shields includes one or more regions that intersect a projection onto the first plane of a middle point of a straight line between the adjacent ones of the parts of the buried grid.

3. The diode device of claim 1, wherein at least one of the plurality of shields is positioned above the first doped type layer.

4. The diode device of claim 1, wherein at least one of the plurality of shields are at least partially positioned recessed into the first doped type layer.

5. The diode device of claim 1, wherein the plurality of shields comprise a third doped type of the wide band gap material of a same second conductivity type as the buried grid.

6. The diode device of claim 1, wherein at least one ohmic contact is disposed in contact with the plurality of shields.

7. The diode device of claim 1, wherein the wide band gap material is selected from a group comprising silicon carbide, diamond, gallium oxide, and gallium nitride.

8. The diode device of claim 1, wherein the wide band gap material comprises epitaxial material.

9. The diode device of claim 1, wherein the buried grid intersects a second plane.

10. The diode device of claim 9, wherein the second plane is spaced apart from the first plane.

11. The diode device of claim 10, wherein the first doped type layer is between the plurality of shields and the buried grid.

12. The diode device of claim 11, wherein a portion of the first doped type layer of wide band gap material is below the buried grid.

13. The diode device of claim 9, wherein at least one of the plurality of shields intersects the first plane and the second plane.

14. The diode device of claim 9, wherein the second plane is co-planar with the first plane.

15. The diode device of claim 9, wherein the second plane and the first plane are parallel.

16. The diode device of claim 1, wherein the plurality of shields are positioned where an electric field around the buried grid exceeds a defined value at the first plane.

17. The diode device of claim 1, wherein the plurality of shields are disposed apart from contact with the buried grid.

18. The diode device of claim 1, wherein the plurality of shields are electrically connected with each other.

19. The diode device of claim 1, wherein the buried grid is foraminous.

20. The diode device of claim 1, wherein the shields overlap with a projection onto the first plane of the plurality of parts of the buried grid.

* * * * *